United States Patent
Kishimoto et al.

[11] Patent Number: 6,129,459
[45] Date of Patent: Oct. 10, 2000

[54] APPARATUS FOR ANALYZING RADIATING ELECTROMAGNETIC WAVE FROM MULTILAYER SUBSTRATE

[75] Inventors: Takeshi Kishimoto; Shinichi Ohtsu; Makoto Mukai, all of Kawasaki, Japan

[73] Assignee: Fujitsu Limited, Kawasaki, Japan

[21] Appl. No.: 09/045,706

[22] Filed: Mar. 23, 1998

[30] Foreign Application Priority Data

Sep. 19, 1997 [JP] Japan ................................ 9-255496

[51] Int. Cl.$^7$ ............................................ G06F 17/50
[52] U.S. Cl. ............................ 395/500.26; 395/500.25; 324/260
[58] Field of Search ................... 395/500.26, 500.27, 395/500.23, 500.25; 324/260, 244; 340/572.1

[56] References Cited

U.S. PATENT DOCUMENTS

| | | | |
|---|---|---|---|
| 5,006,788 | 4/1991 | Goulette et al. | 324/95 |
| 5,650,935 | 7/1997 | Nishino et al. | 364/481 |
| 5,745,370 | 4/1998 | Ohtou et al. | 364/488 |
| 5,812,434 | 9/1998 | Nagase et al. | 364/578 |
| 5,903,477 | 5/1999 | Otsu et al. | 364/578 |

FOREIGN PATENT DOCUMENTS

| | | | |
|---|---|---|---|
| 0135089 | 3/1985 | European Pat. Off. | H01L 23/52 |
| 0489118 B1 | 1/1995 | European Pat. Off. | H05K 1/14 |
| 7-302278 | 11/1995 | Japan. | |
| 9-112632 | 4/1997 | Japan. | |

*Primary Examiner*—Kevin J. Teska
*Assistant Examiner*—Thai Phan
*Attorney, Agent, or Firm*—Staas & Halsey LLP

[57] ABSTRACT

The electromagnetic field intensity of an electromagnetic wave radiating from a multilayer substrate is correctly computed. A radiating electromagnetic wave analysis apparatus comprises a signal layer electric current distribution computation unit for obtaining the distribution of an electric current flowing through a signal layer in a distributed constant line approximation method or a transmission line analysis method; a multilayer substrate electric current distribution computation unit for computing the distribution of an electric current of an entire multilayer substrate in a moment method based on the distribution of the electric current obtained by the signal layer electric current distribution computation unit; and an electromagnetic field intensity computation unit for computing the electromagnetic field intensity of an electromagnetic wave radiating from a multilayer substrate based on the distribution of the electric current of the entire multilayer substrate computed by the multilayer substrate electric current distribution computation unit. The radiating electromagnetic wave analysis apparatus establishes a modelling method for quantitatively analyzing the state of the electric current flowing through a wave source and load and then flowing into a power supply layer and a ground layer.

10 Claims, 26 Drawing Sheets

FIG. 1
(PRIOR ART)
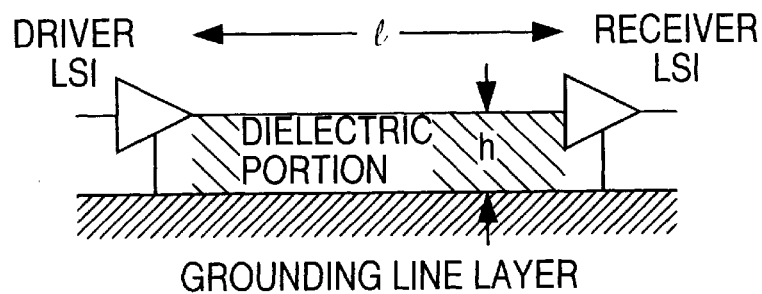
GROUNDING LINE LAYER
⇩
ELECTRIC CURRENT
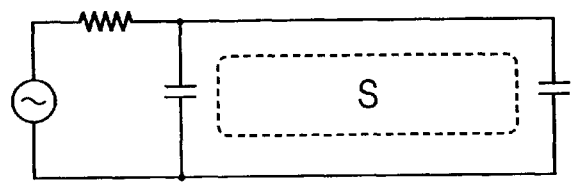
| AMOUNT OF ELECTRIC WAVE RADIATION | ∝ FREQUENCY² X | ELECTRIC CURRENT (UNIFORM) | X | LOOP AREA |

FIG. 2
(PRIOR ART)
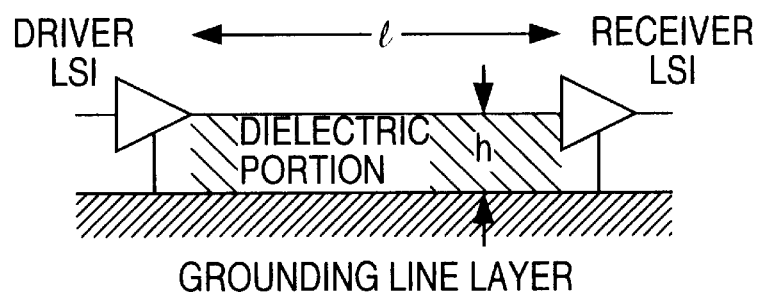
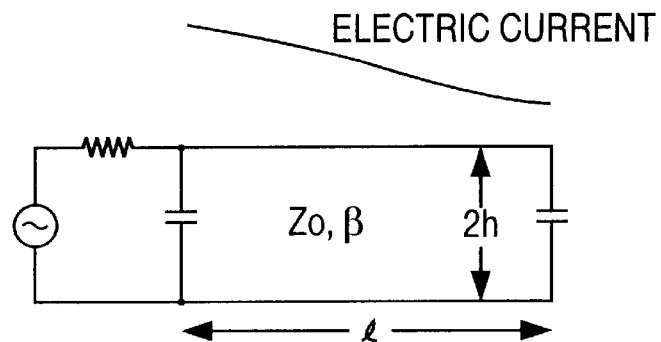
| AMOUNT OF ELECTRIC WAVE RADIATION | = | ELECTRIC CURRENT DISTRIBUTION DEPENDENCE |

Zc: LINE CHARACTERISTIC IMPEDANCE
β(f): PROPAGATION CONSTANT OF LINE
f: FREQUENCY

FIG. 19
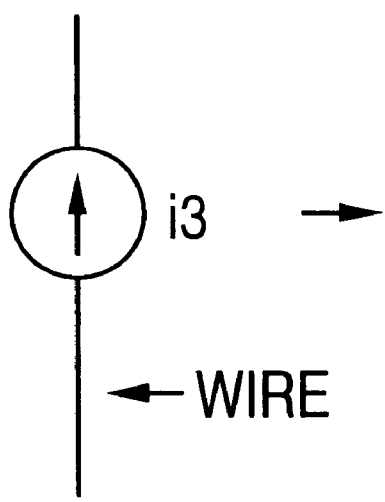
ELECTRIC CURRENT SOURCE
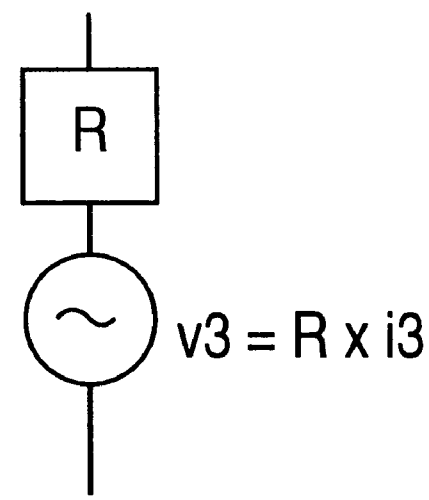
VOLTAGE SOURCE

FIG. 23
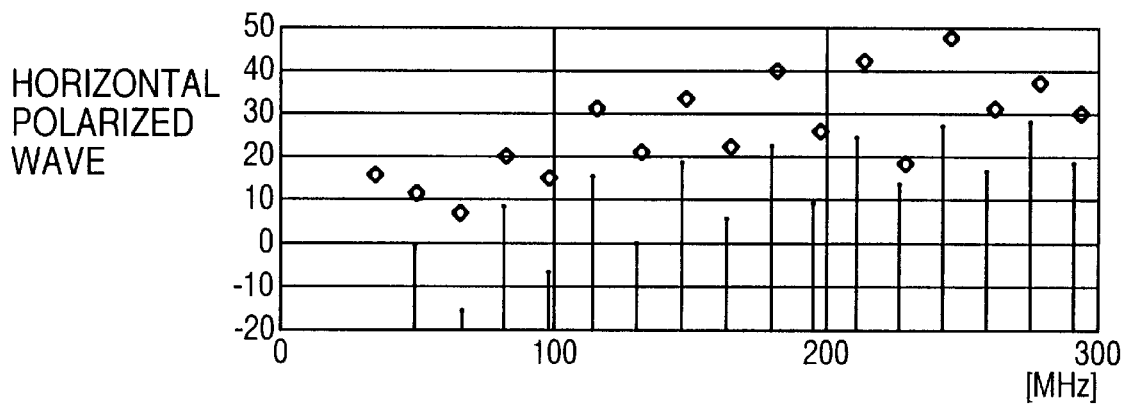
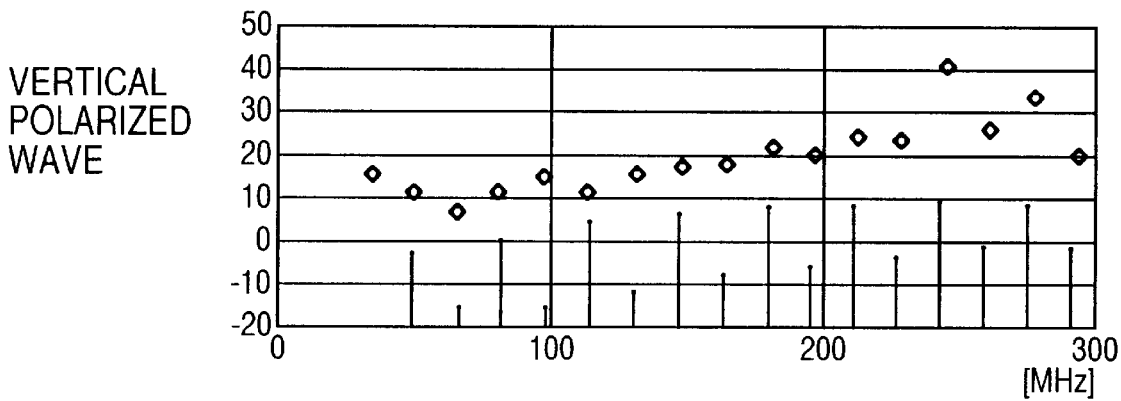

FIG. 24
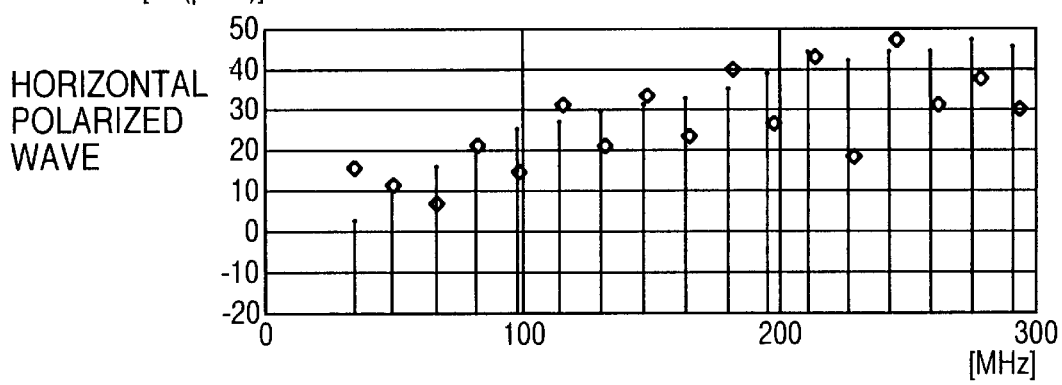
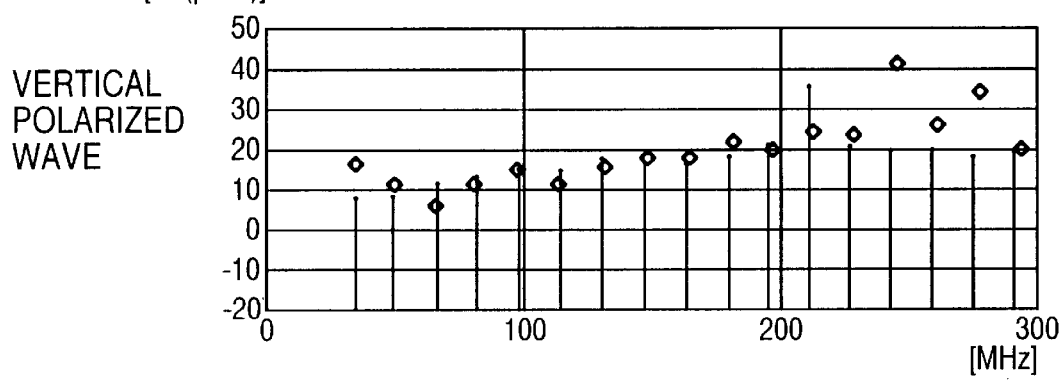

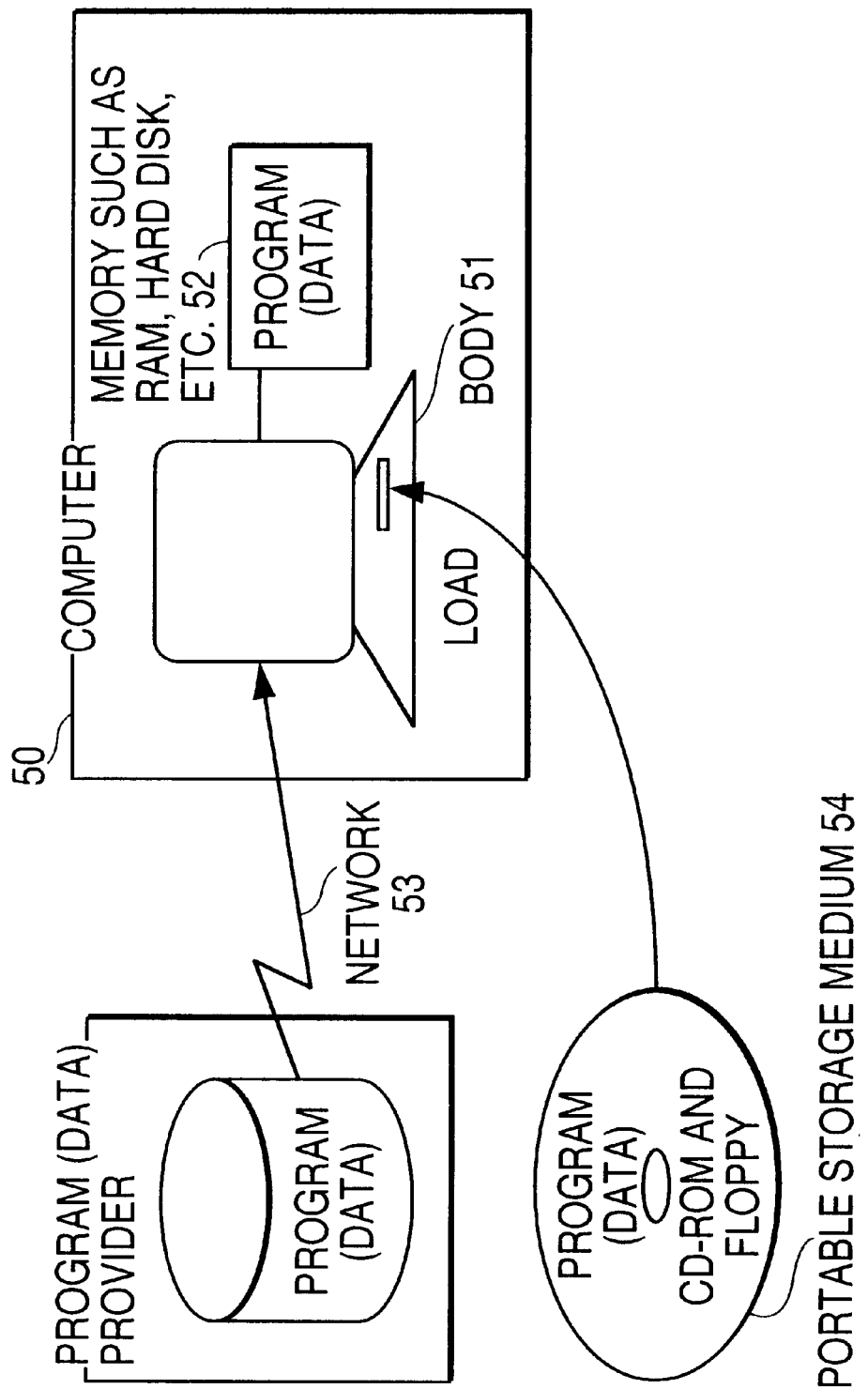

APPARATUS FOR ANALYZING RADIATING ELECTROMAGNETIC WAVE FROM MULTILAYER SUBSTRATE

BACKGROUND OF THE INVENTION

1. Field of the Invention

The present invention relates to an apparatus for analyzing the electromagnetic wave radiating from a multilayer substrate, and more specifically to an electromagnetic wave analysis apparatus for obtaining the distribution of electric currents flowing through a signal layer based on the distributed constant line approximation method or the transmission line analysis method, and computing the distribution of the electric currents of the entire multilayer substrate and the electromagnetic field intensity of the radiating electromagnetic wave based on the obtained results.

2. Description of the Related Art

The social regulations relating to electric circuit devices prohibit the radiation of electromagnetic waves and noises exceeding a predetermined level according to the strict regulations of a number of countries.

To satisfy these regulations relating to electromagnetic waves, various technologies such as a shielding technology, a filtering technology, etc. are to be adopted. In order to practically adopt these technologies, it is necessary to develop a simulation technology to quantitatively compute how effective the technologies are in reducing radiating electromagnetic waves.

Based on the above described background, the Applicant et al. have disclosed the invention of a simulation technology for computing the electromagnetic field intensity generated by an electric circuit device basically using a moment method. To establish the simulation technologies, an exact model of an electric circuit device should be prepared.

The electromagnetic field intensity generated by an object can be simulated by computing an electric current flowing through each portion of an object for substitution in a well-known theoretical equation for electromagnetic wave radiation. The electric current flowing through each portion of the object can be logically obtained by solving Maxwell's equation for an electromagnetic field. However, it is hard to solve Maxwell's equation for an electromagnetic field under optional boundary conditions for an object having an optional shape.

Therefore, all analytical methods for calculating an electric current used in a current electromagnetic field intensity computation device are approximation methods, with variations in accuracy. Currently, there are three approximation methods, that is, the small loop antenna approximation method, the distributed constant line approximation method, and the moment method.

In the small loop antenna approximation method, a line connecting a wave source circuit and a load circuit is processed as a loop antenna, and the current flowing through the loop is assumed to be constant, and is obtained by a computation method for a lumped constant circuit. FIG. 1 shows the small loop antenna approximation method.

The computation by the small loop antenna approximation method is the simplest of the three methods, but is rarely used these days because of low precision when the size of a loop is not small in comparison with the wavelength of an electromagnetic wave.

On the other hand, in the distributed constant line approximation method, an electric current can be obtained by applying an equation of a distributed constant line to an object which can be approximated to a one-dimensional structure. In this method, the computation is relatively simple, and the time required for computation and the amount of computation increase almost in proportion to the number of elements to be analyzed. Therefore, such phenomena as the reflection, the resonance, etc. of a line can also be analyzed. As a result, a high-speed and high-precision analysis can be realized for an object which can be approximated to a one-dimensional structure. FIG. 2 shows the configuration according to the distributed constant line approximation method.

The computation based on the distributed constant line approximation method has the problem that a high-speed and high-precision analysis can be performed for an object which can be approximated to a one-dimensional object, but cannot be performed for an object which cannot be approximated.

On the other hand, the moment method is one of the solutions of an integral equation obtained from Maxwell's equation for electromagnetic wave motion, and can be applied to an object having an optional three-dimensional shape. Practically, an electric current is computed with an object divided into small elements.

A reference document of the moment method can be H. N. Wanq, J. H. Richmond and M. C. Gilreath: "Sinusoidal reaction formulation for radiation and scattering from conducting surface" IEEE TRANSACTIONS ANTENNAS PROPAGATION vol. AP-23 1975.

In this moment method, the structure of an electric circuit device to be simulated is designed as a mesh. The mutual impedance and the mutual admittance between elements are computed in a predetermined computing process for a target frequency, and are used for substitution in simultaneous equations together with the wave source specified in the structure information such as the obtained mutual impedance, etc. The electric current flowing through each element can be obtained by solving the simultaneous equations.

That is, when a metallic object is processed, the metallic portion is designed as a mesh to be analyzed. The mutual impedance $Z_{ij}$ between the mesh metallic elements is obtained, and the following simultaneous equations of the moment method established among the mutual impedance $Z_{ij}$, the wave source $V_i$, and the electric current $I_i$ flowing through the mesh metallic element, are solved to obtain the electric current $I_i$, thereby computing the electromagnetic field intensity.

$$[Z_{ij}][I_i]=[V_i]$$

where[ ] indicates a matrix.

When a resistance, a capacitance, and an inductance exist in the mesh, they form part of the self-impedance elements of the mesh.

Most electric circuit devices have multilayer substrates on which a power supply layer, a ground layer, and a signal layer are mounted in a layer structure separated by layers of an isolation material, when a high-density implementation is realized.

FIG. 3A shows an example of the layered structure of a multilayer substrate. FIG. 3B shows an example of the signal layer of a multilayer substrate. As shown in FIG. 3A, nine layers are laminated into a multilayer substrate. The nine layers are, sequentially from top to bottom, a signal layer 1; a first core material 2 made of epoxy-glass, etc.; a first preimpregnated layer 3 made of an insulator for adjustment of thickness, etc.; a power supply layer 4; a second core material 5; a ground layer 6; a second preimpregnated layer 7; a third core material 8; and a second signal layer 9.

The first signal layer 1 and the second signal layer 9 implement a circuit pattern using a metal such as copper foil, etc. as shown in FIG. 3B. According to the circuit pattern, circuit parts such as chip parts are arranged to implement an electronic circuit. Between the electronic circuit and the power supply layer 4 or the ground layer 6, there is a hole called "a through-hole" through which layers are electrically connected, and the electronic circuit has a power supply and is grounded.

Thus, an electronic circuit is implemented in the signal layer of the multilayer substrate, and an electromagnetic wave having a high electromagnetic field intensity radiates from the electronic circuit.

As described above, in a device for analyzing an electromagnetic wave radiating from a multilayer substrate, a signal layer by which an electronic circuit is implemented has been considered to be a main source for radiating electromagnetic waves for use in analysis. However, it has been clear that the radiation of electromagnetic waves from a power supply layer and a ground layer cannot be ignored. Therefore, it is indispensable to analyze a radiated electromagnetic wave with the influence of a ground layer taken into account.

Although the radiation of an electromagnetic wave from a power supply layer or a ground layer cannot be ignored, there has been the problem that no appropriate models of a power supply layer and a ground layer have been developed and the radiated electromagnetic waves cannot be correctly analyzed. Furthermore, there has been the problem that no effective methods have been developed to determine how an electric current flowing through a wave source and a load flows into a power supply layer and a ground layer when a complementary metal-oxide semiconductor device (CMOS) IC driver is used, thereby preventing the distribution of electric currents radiating electromagnetic waves from being correctly obtained.

SUMMARY OF THE INVENTION

The present invention aims at providing an electromagnetic wave analysis apparatus capable of correctly computing the electromagnetic field intensity of electromagnetic waves radiating from a multilayer substrate including electromagnetic waves radiating from a power supply layer and a ground layer, by establishing a modelling method in which the state of an electric current flowing through a wave source and a load, and flowing into the power supply layer and the ground layer can be quantitatively analyzed.

To attain the above described purpose, the apparatus for analyzing electromagnetic waves radiating from a multilayer substrate according to the present invention includes a signal layer current distribution computation unit for computing the distribution of the electric current flowing through a signal layer by a distributed constant line approximation method or a transmission line analysis method; a multilayer substrate electric current distribution computation unit for computing the distribution of the electric current throughout the multilayer substrate by a moment method based on the distribution of the electric current obtained by the signal layer electric current distribution computation unit; and an electromagnetic field intensity computation unit for computing the electromagnetic field intensity of the electromagnetic waves radiating from the multilayer substrate based on the computed distribution of the electric current throughout the multilayer substrate.

With the above described configuration, a model of quantitatively analyzing the state of an electric current which flows through a wave source and a load, and flows into a power supply layer and a ground layer can be quantitatively analyzed. After obtaining the distribution of the electric current flowing through the signal layer by the distributed constant line approximation method or the transmission line analysis method, the entire multilayer substrate including the power supply layer and the ground layer is analyzed by the moment method. Thus, the scope of the analysis can be practically determined and can be performed with high precision.

BRIEF DESCRIPTION OF THE DRAWINGS

FIG. 1 shows the small loop antenna approximation method;

FIG. 2 shows the distributed constant line approximation method;

FIG. 19 shows the method of converting an electric current source into an electric voltage source in case of using the moment method;

FIG. 23 shows the result of the computation of the electromagnetic field spectrum when the present invention is not applied:

FIG. 24 shows the result of the computation of the electromagnetic field spectrum when the present invention is applied:

FIG. 26 shows how the electromagnetic wave analysis program is loaded onto the computer system.

DESCRIPTION OF THE PREFERRED EMBODIMENT

Figure 4:
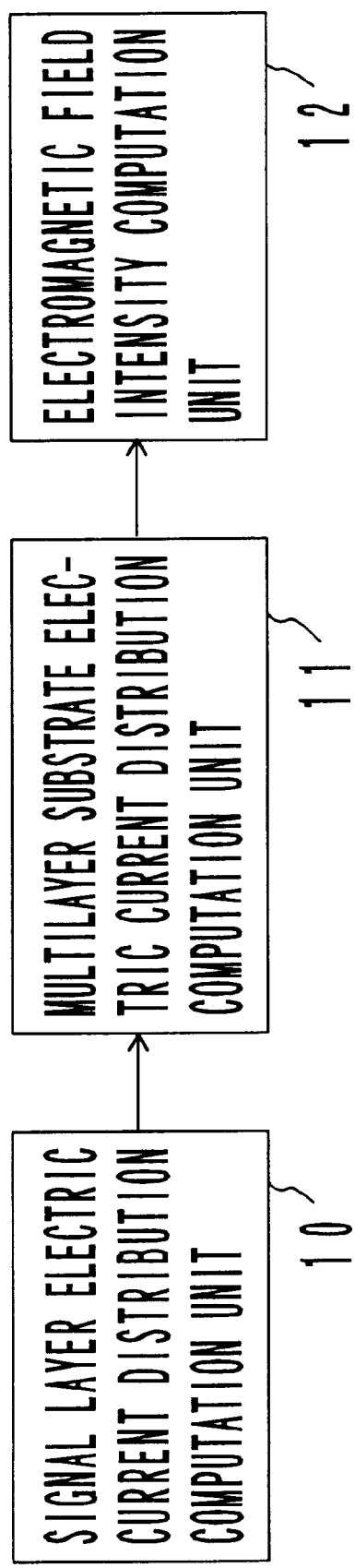
FIG. 4 is a block diagram showing the configuration according to the principle of the present invention.

FIG. 4 is a block diagram showing the principle of the present invention.

In FIG. 4, a signal layer electric current distribution computation unit 10 obtains the distribution of the electric current flowing through a signal layer by a distributed constant line approximation method or a transmission line analysis method.

A multilayer substrate electric current distribution computation unit 11 computes the distribution of an electric current flowing through the entire multilayer substrate by the moment method based on the distribution of the electric current obtained by the signal layer electric current distribution computation unit 10.

The electromagnetic field intensity of the electromagnetic wave radiating from a multilayer substrate is computed based on the distribution of the electric current obtained by the electromagnetic field intensity computation unit 12 and the multilayer substrate electric current distribution computation unit 11.

When the distribution of the electric current flowing through the signal layer is obtained by the distributed constant line approximation method according to the present invention, the electric current of a wave source is first obtained. If the electric current of the wave source comes from a CMOS IC driver, the two rectangular waves corresponding to the duty ratio of the IC driver are multiplied by the obtained electric current of the wave source. Thus, the electric current of the wave source is divided into two, and respectively inserted as electric current sources between the power supply layer and the signal layer and between the ground layer and the signal layer.

Based on the distribution of the electric current on the distributed constant line obtained by the signal layer electric current distribution computation unit 10, the distribution of the electric current in the entire multilayer substrate, that is, the distribution of the electric current in the entire multilayer substrate containing the portion between the power supply layer and the ground layer can be computed by the moment method.

As described above, according to the present invention, a model is generated in such a way that the state of the electric current flowing through a wave source and a load and flowing into a power supply layer and a ground layer can be quantitatively analyzed. After the distribution of the electric current flowing through a signal layer is obtained by the distributed constant line approximation method, the entire multilayer substrate containing the power supply layer and the ground layer is analyzed by the moment method. Thus, the analysis can be performed on a practical scale, and a result is obtained with high precision.

Figure 3A:
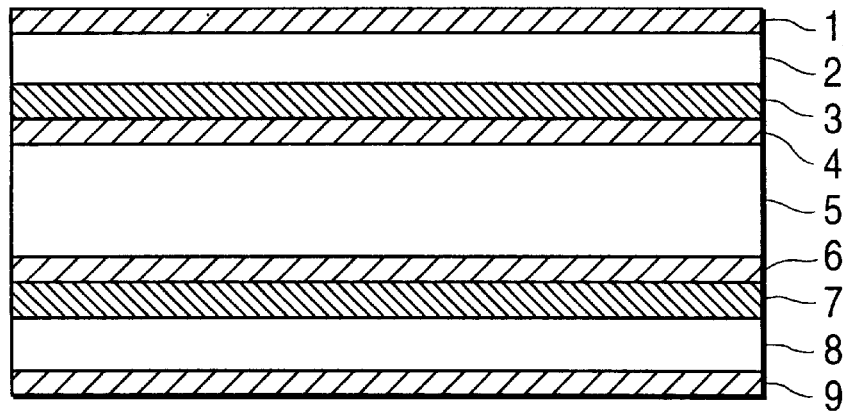
FIG. 3A shows an example of a structure of the is layers of a multiple-layer substrate.
Figure 3B:
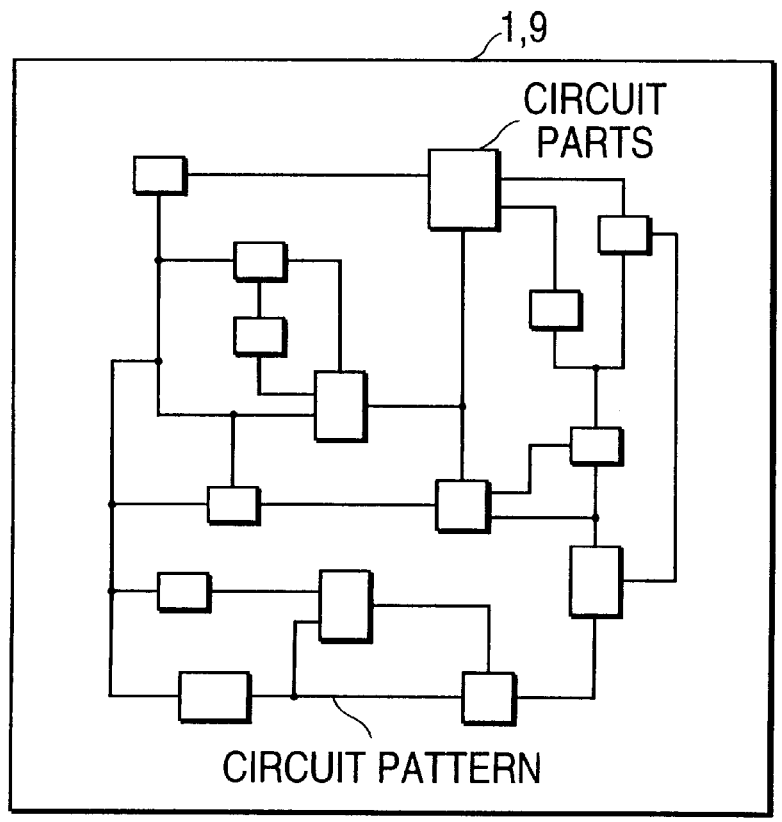
FIG. 3B shows an example of a structure of the signal layer of the multilayer substrate.
Figure 5:
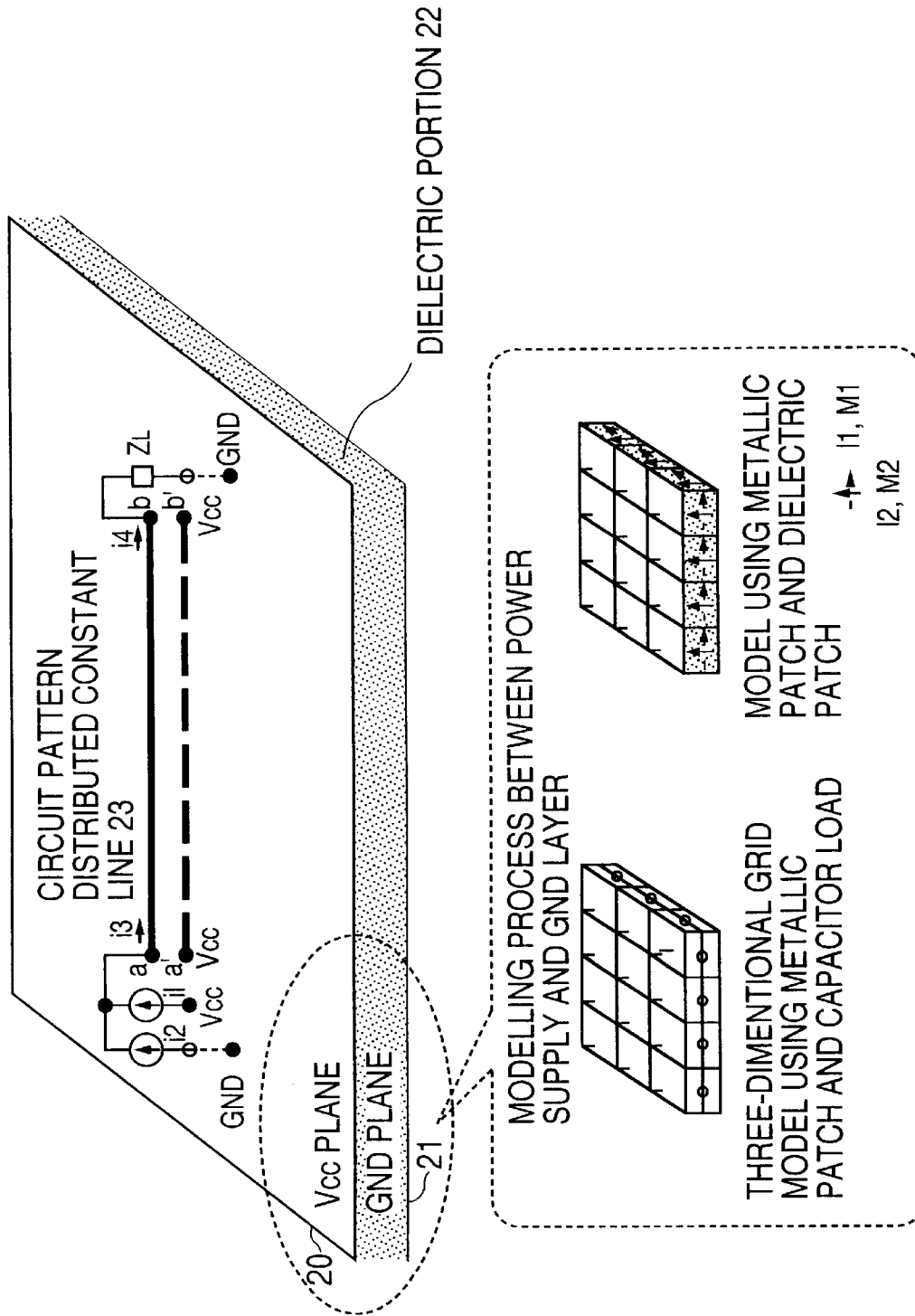
FIG. 5 shows the entire model of the multilayer substrate.

FIG. 5 shows the entire model of a multilayer substrate. In FIG. 5, a dielectric portion 22 corresponding to the second core material 5 shown in FIG. 3A is inserted between a Vcc plane 20 corresponding to the power supply layer 4 shown in FIG. 3A and a GND plane 21 corresponding to the ground layer 6 shown in FIG. 3A. Furthermore, for example, an electric current in the circuit pattern corresponding to the first signal layer 1 shown in FIG. 3A is indicated as an electric current flowing through a distributed constant line 23.

The format of a model between a power supply layer and a ground layer can be a three-dimensional grid model formed by a metallic patch and a capacitor load which is subject to a patent application by the applicant et al., or can be a model which is formed by a metallic patch and a dielectric patch. These models are described later.

Described below is the reason why the electric current of a signal layer can be obtained using a distributed constant line model. Normally, the electric current in a signal layer flows as distributed on a plane in a return process. In the return process, the line can be approximated by a single cable in an electric image method. As a result, the electric current flowing through a signal layer can be obtained by the distributed constant line approximation method.

Figure 6:
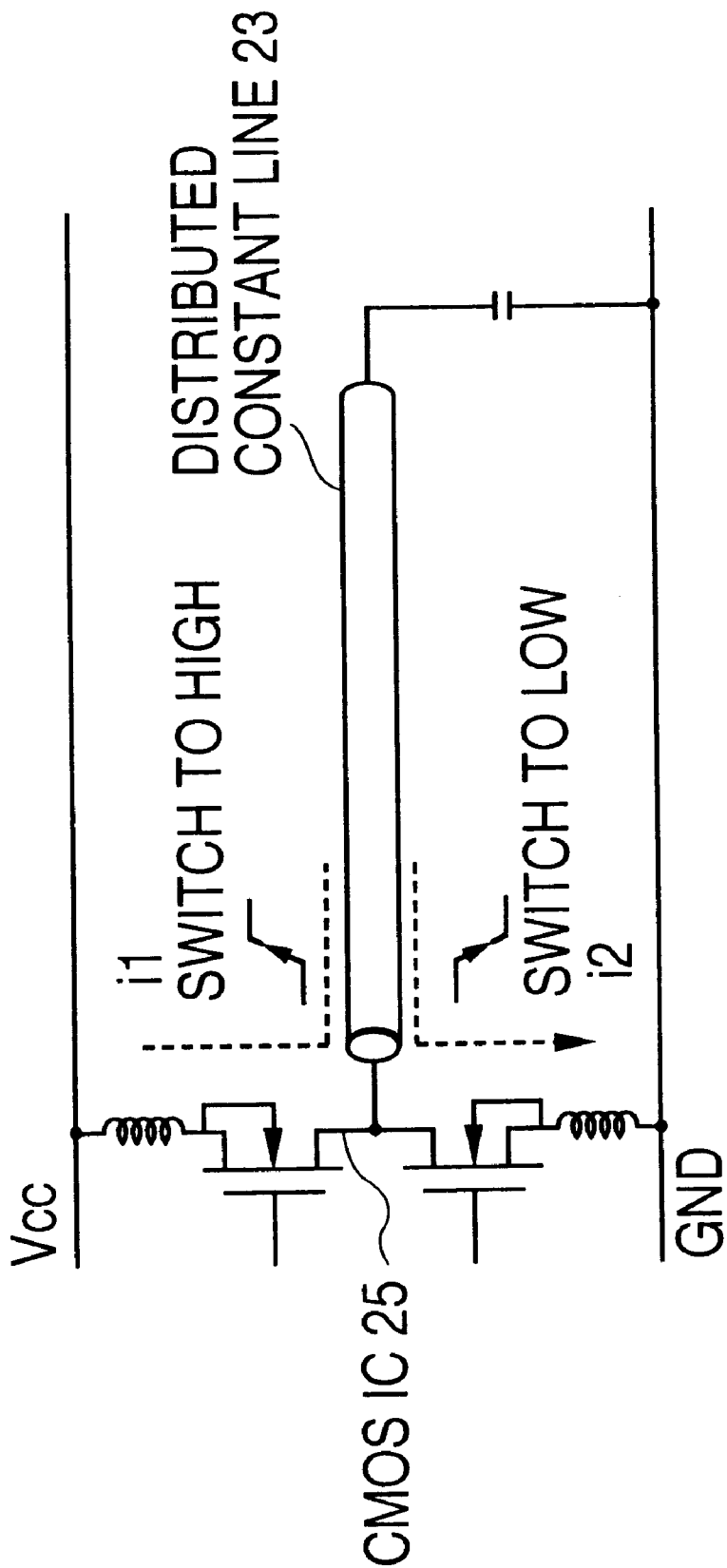
FIG. 6 shows the method of dividing an electric current $i_3$ of a wave source in a model of a multilayer substrate.

In FIG. 5, the electric current at the input terminal of the distributed constant line 23, that is, the electric current $i_3$ of the wave source, is divided into an electric current source $i_1$ indicating the electric current from a power supply layer and an electric current source $i_2$ indicating the electric current from a ground layer. FIG. 6 shows how the electric current $i_3$ of the wave source in the model of a multilayer substrate is divided. In FIG. 6, the input voltage of the distributed constant line 23 is provided as an output voltage from a CMOS IC 25. When the output voltage indicates an H level, the electric current input to the distributed constant line 23 is $i_1$. When the output voltage indicates an L level, the electric current input to the distributed constant line 23 is $i_2$. In FIG. 5, the electric current between the circuit pattern and the ground layer (GND plane) flows in the opposite direction of the electric current source $i_2$. In this example, the direction of the electric current source $i_2$ is assumed as shown in FIG. 5.

Figure 7:
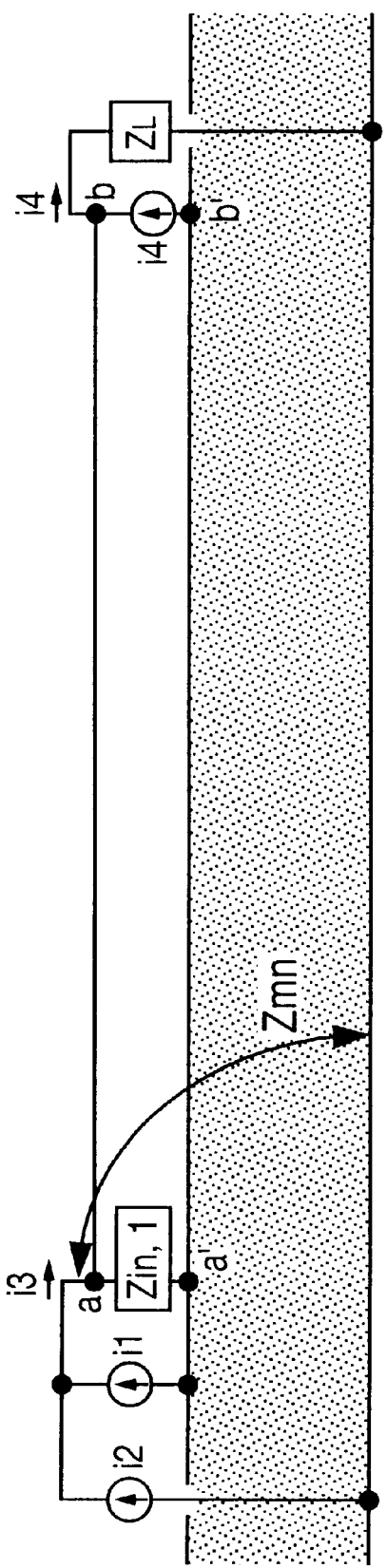
FIG. 7 shows the method of obtaining the electric current $i_3$ of the wave source by the distributed constant line approximation method, and the method of dividing the electric current $i_3$ into two electric current sources $i_1$ and $i_2$.

The system of analyzing the electromagnetic wave in the model of a multilayer substrate shown in FIG. 5 is described below by referring to FIGS. 7 through 9. FIG. 7 shows how the electric current $i_3$ of a wave source is obtained by the distributed constant line approximation method using a multilayer substrate model, and shows how the electric current $i_3$ is divided into the electric current source $i_1$ and the electric current source $i_2$. In FIG. 7, the electric current $i_3$ flowing through the wave source is first obtained by the distributed constant line approximation method. At this time, the load impedance $Z_L$ at the output terminal (load terminal) between the distributed constant line and the ground layer is computed by the moment method. Then, the rectangular wave based on the duty ratio for the IC driver is multiplied by the electric current $i_3$ of the wave source to obtain the waveforms of the two electric current sources $i_1$ and $i_2$.

When the electric current flowing through a signal layer is obtained using a circuit analysis tool such as the scientific personal integrated computing environment (SPICE), etc., the electric current sources $i_1$ and $i_2$ are directly obtained, and the electric current $i_3$ of the wave source is obtained as a sum of them. The above described circuit analysis tool obtains an electric current by the transmission line analysis method.

Figure 8:
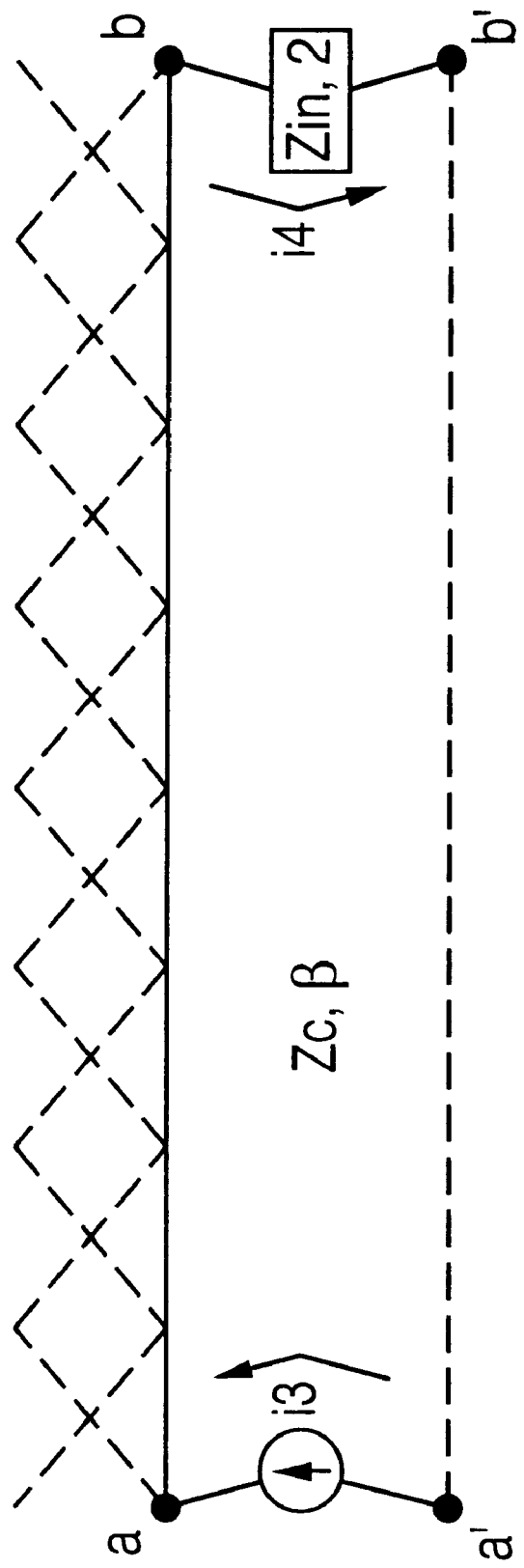
FIG. 8 shows the method of computing the distribution of the electric current flowing through the signal layer in a model of the multilayer substrate.

FIG. 8 shows the method of computing the distribution of the electric current flowing through a signal layer. In FIG. 8, the distribution of the electric current flowing through the distributed constant line 23, that is, the distribution of the electric current flowing through the signal layer, is computed using as the source of an electric current the electric current $i_3$ of the wave source obtained as shown in FIG. 7. Simultaneously, the electric current $i_4$ at the output terminal of the distributed constant line 23 can be obtained.

Figure 9:
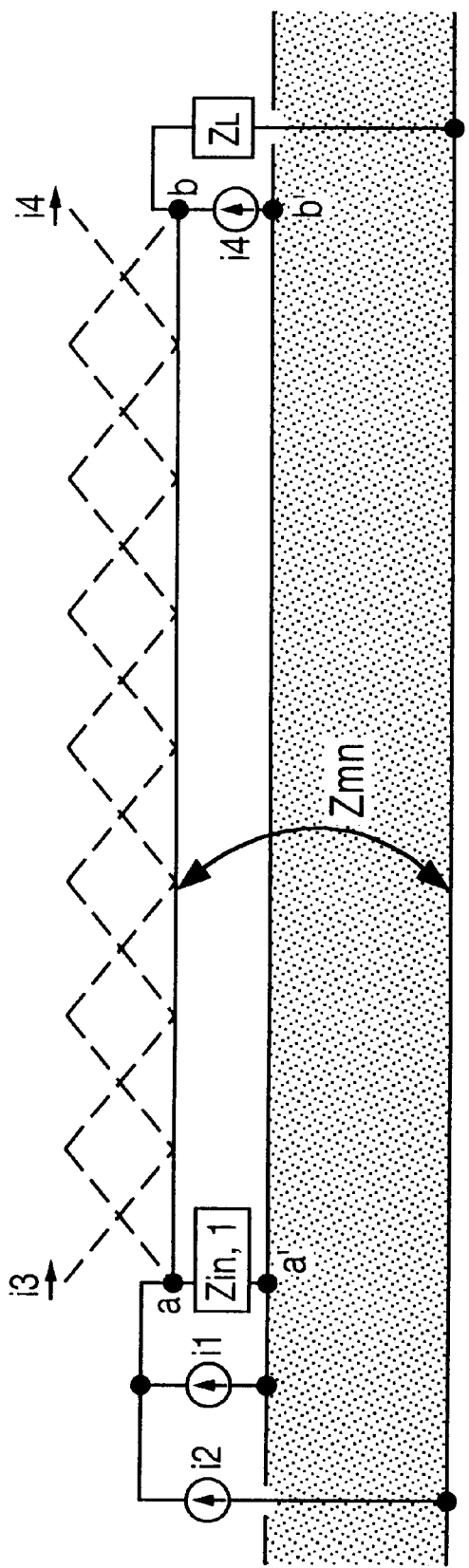
FIG. 9 shows the method of computing the distribution of the electric current throughout the multilayer substrate in a model of the multilayer substrate.

FIG. 9 shows the method of computing the distribution of the electric current throughout the multilayer substrate in the model of the multilayer substrate, that is, the distribution of the electric current throughout the multilayer substrate including the portion between the power supply layer and the ground layer. In FIG. 9, the distribution of the electric current obtained as shown in FIG. 8 is processed as an electric current preliminarily existing in the multilayer substrate, and the electric current flowing through another portion in the multilayer substrate is computed by the moment method.

Figure 10:
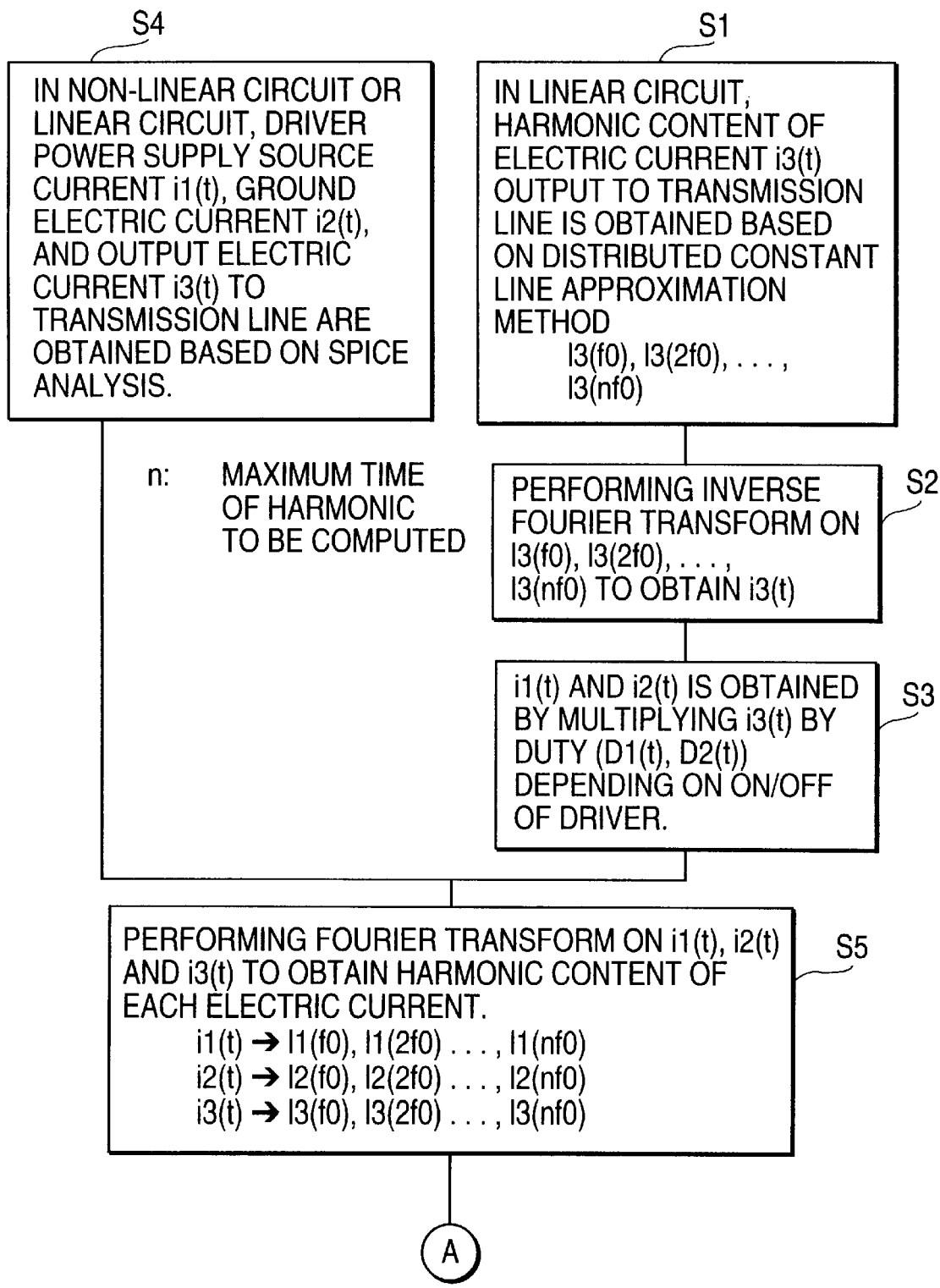
FIG. 10 is a flowchart (1) showing the entire process of analyzing an electromagnetic wave.
Figure 11:
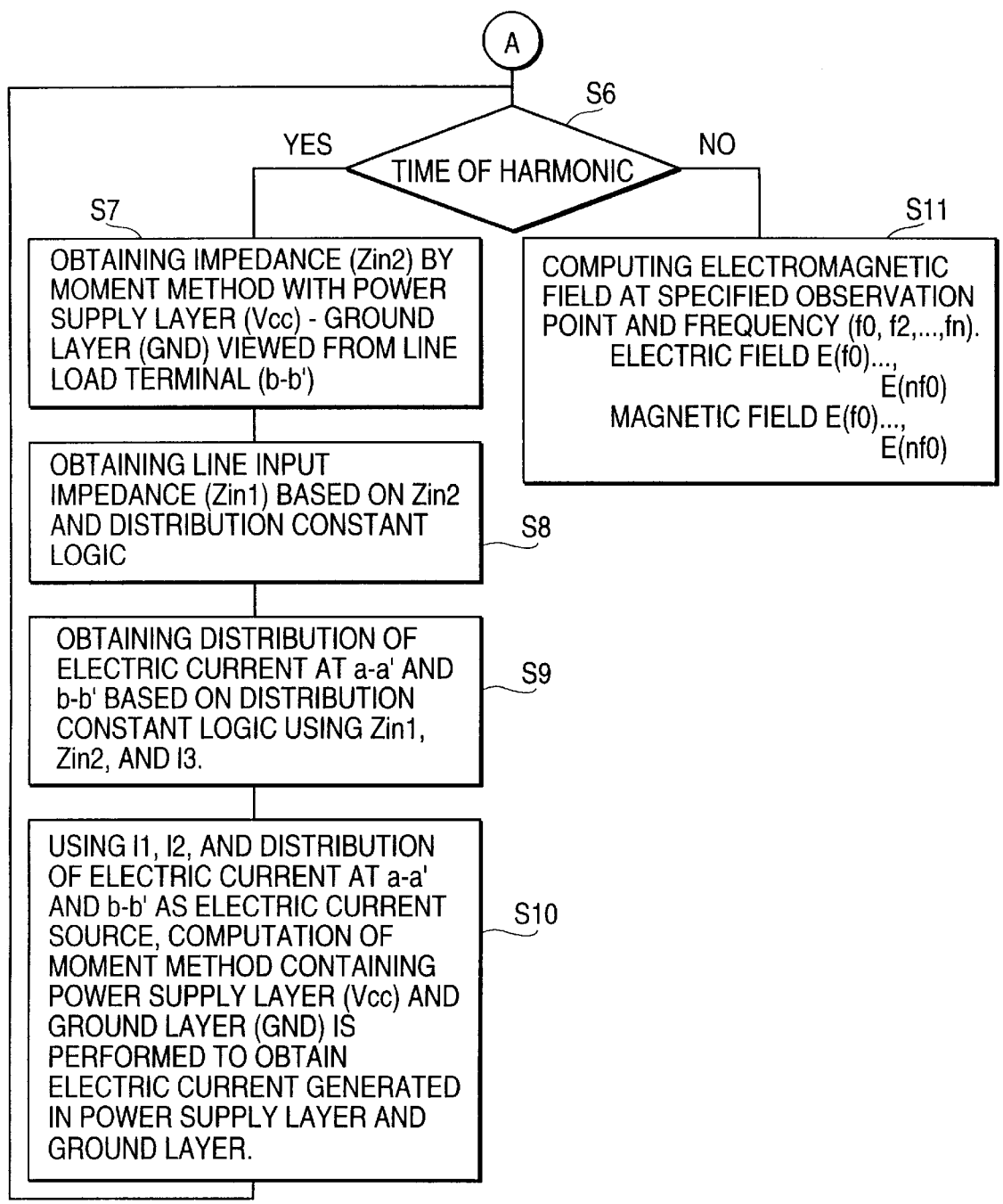
FIG. 11 is a flowchart (2) showing the entire process of analyzing an electromagnetic wave.

FIGS. 10 and 11 are flowcharts showing the entire process according to the present invention as shown in FIGS. 7 through 9. The process in each step shown in these figures is described later in detail as necessary. FIG. 10 is a flowchart (1) showing the entire process of analyzing an electromagnetic wave. When the electronic circuit in the signal layer is a linear circuit in FIG. 10, the processes in steps S1 through S3 are performed according to the distributed constant line approximation method. When it is a non-linear circuit, the process in step S4 is performed. The process in step S4 can also be performed on a linear circuit.

In step S1, the harmonic content $I_3$, ($f_0$), $I_3$ ($2f_0$), ..., $I_3$ ($nf_0$) of the electric current of a wave source, that is, the output electric current $i_3$ to the transmission line, is obtained based on the distributed constant circuit theory. The $f_0$ indicates the frequency of the fundamental harmonic of the electric current $i_3$. Next, in step S2, the inverse Fourier transform is performed on the harmonic contents to obtain the electric current $i_3$. In step S3, the electric current $i_3$ is multiplied by the rectangular waves $D_1$ and $D_2$ depending on the on/off duty ratio of the IC driver in order to obtain the electric currents $i_1$ and $i_2$ of the two electric current sources.

In step S4, for example, the SPICE is used as a circuit analysis tool regardless of a linear or non-linear electronic circuit as a circuit pattern. The electric current $i_1$ from the power supply to the driver and the electric current $i_2$ from the power supply to the ground are directly obtained. The electric current $i_3$ of the wave source is obtained as a sum of them.

After the processes in steps S1 through S3, or step S4, the Fourier transform is performed on the three electric currents $i_1$, $i_2$, and $i_3$ in step S5 to obtain the harmonic content of each of the electric currents. For a linear circuit, the harmonic content for the electric current $i_3$ of a wave source has already been obtained in step S1.

FIG. 11 shows a flowchart (2) showing the entire process of analyzing an electromagnetic wave. In FIG. 11, the electric current is computed for each harmonic content obtained in step S5 shown in FIG. 10, and the generated electromagnetic field intensity is computed. In this example, the electric current is computed until the order of the harmonic reaches n, and then the generated electromagnetic field intensity is computed.

That is, if it is determined in step S6 that the order of the harmonic is equal to or smaller than n, then the input impedance $Z_{in2}$ viewed from the load terminal of the distributed constant line, that is, the output terminal b—b', between the power supply layer and the ground layer is obtained in the moment method in step S7. In step S8, the input impedance $Z_{in1}$ of the entire distributed constant line is obtained. In step S9, the distribution of the electric current through the line between the input terminal a—a' and the load terminal b—b' is obtained. In step S10, the electric currents $i_1$ and $i_2$, and the electric current flowing throughout the multilayer substrate containing a power supply layer and a ground layer using the distribution of the electric current in the distributed constant line as an existing electric current source in the multilayer substrate are computed in the moment method.

When the processes in steps S7 through S10 terminate for the order (up to n) of the harmonic to be computed, it is determined in step S6, that the time of the harmonic has exceeded n. In step S11, the electromagnetic field intensity, that is, the electromagnetic field intensity and the magnetic field intensity, is computed for a specified check point and frequency.

Figure 12:
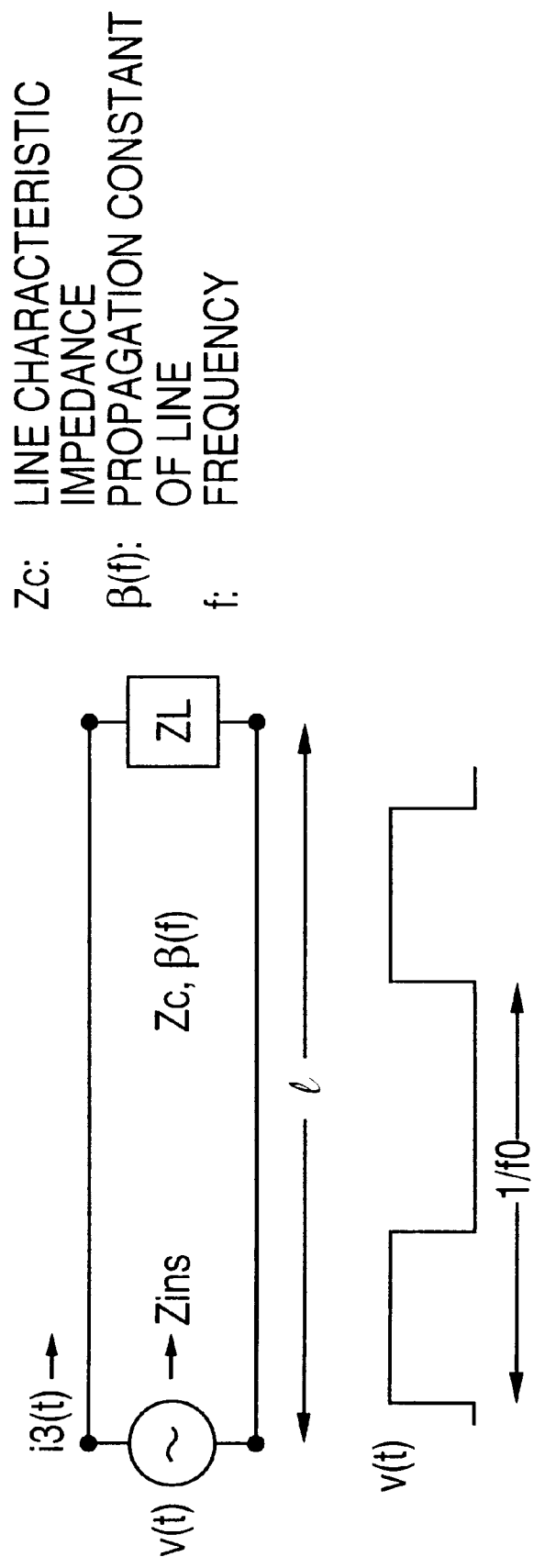
FIG. 12 shows the method of computing the electric current $i_3$ of a wave source in a distributed constant line.

Described below is the detailed explanation of each step shown in FIGS. 10 and 11. FIG. 12 shows the method of computing the electric current $i_3$ of a wave source in the distributed constant line. FIG. 12 shows how the electric current $i_3$ of the wave source is obtained in steps S1 and S2. If the IC driver and the load are linear in FIG. 12, each harmonic current of a wave source can be obtained according to the distributed constant circuit theory.

In FIG. 12, a Fourier transform is performed on the power supply voltage v(t) to obtain the harmonic content V($f_0$), V($2f_0$), ..., V($nf_0$). The harmonic current distribution $I_3$ ($kf_0$) is obtained for each of the harmonic voltage contents by the following equation using the impedance $Z_{ins}$ based on the start of the distributed constant line 23. The $Z_c$ in the following equation indicates the characteristic impedance of the line, and the B($kf_0$) indicates the propagation constant of the line. The v(t) indicates an output waveform of the CMOS IC 25 shown in FIG. 6.

$$I_3(kf_0)=V(kf_0)/Z_{ins}, k=1,2, \ldots, n$$

where $$Z_{ins} = Z_c \frac{Z_L + jZ_c \tan\beta(kf_0)l}{Z_c + jZ_L \tan\beta(kf_0)l}$$

The electric current $i_3$ is obtained by performing an inverse Fourier transform on each of the harmonic contents of the obtained electric current $i_3$ of the wave source.

Figure 13:
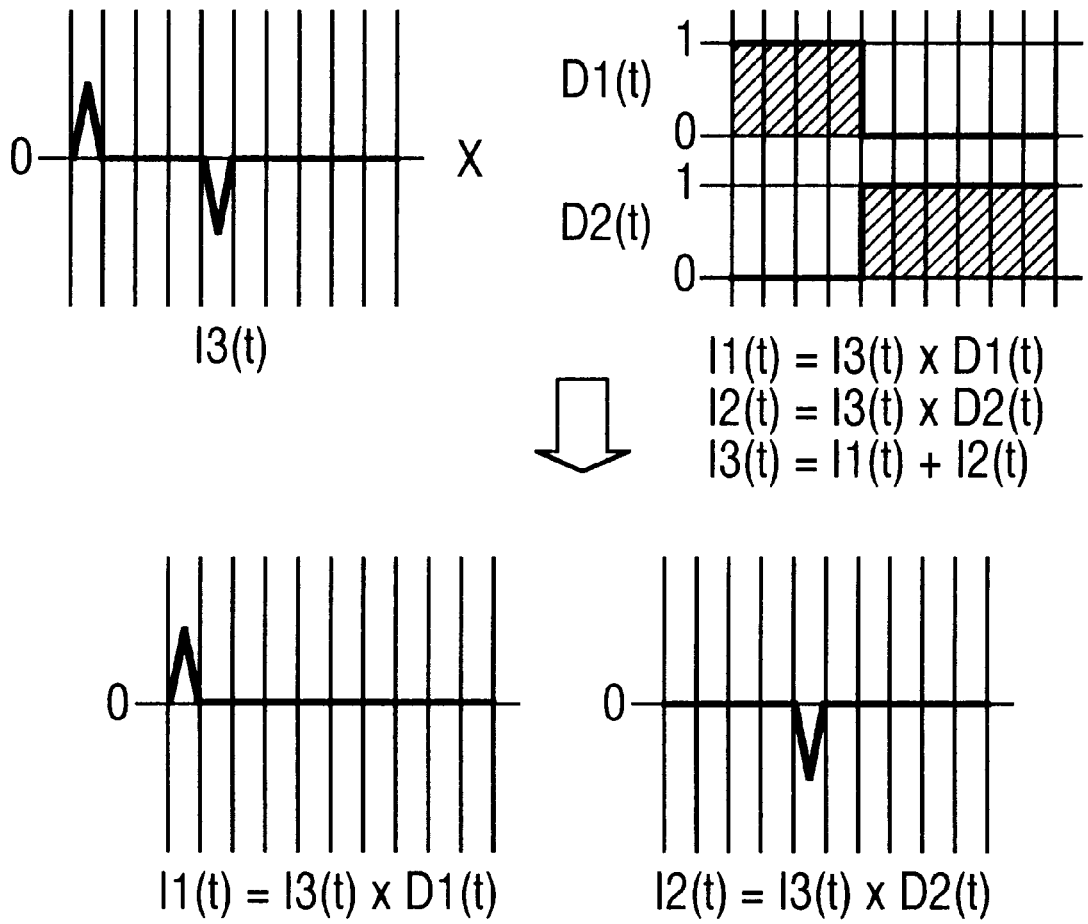
FIG. 13 shows the method of dividing the electric current $i_3$ into two electric current sources.

FIG. 13 shows the method of dividing the electric current $i_3$ of a wave source into two electric current sources $i_1$ and $i_2$. As shown in FIG. 13, the wave form of the electric current $i_3$ of the wave source is multiplied by the rectangular waves $D_1$ and $D_2$ corresponding to the duty ratio of the IC driver to obtain the electric current source $i_1$ flowing from a power supply to a IC driver and the electric current source $i_2$ flowing from a power supply to a ground side. In this example, the duty ratio to the IC driver is set to 0.4 for ON and 0.6 for OFF. However, the duty ratio can be optionally determined.

The harmonic contents of electric currents $i_1$ and $i_2$ are obtained by performing the Fourier transform on the thus obtained electric currents $i_1$ and $i_2$ as described above by referring to step S5 shown in FIG. 10.

Figure 14:
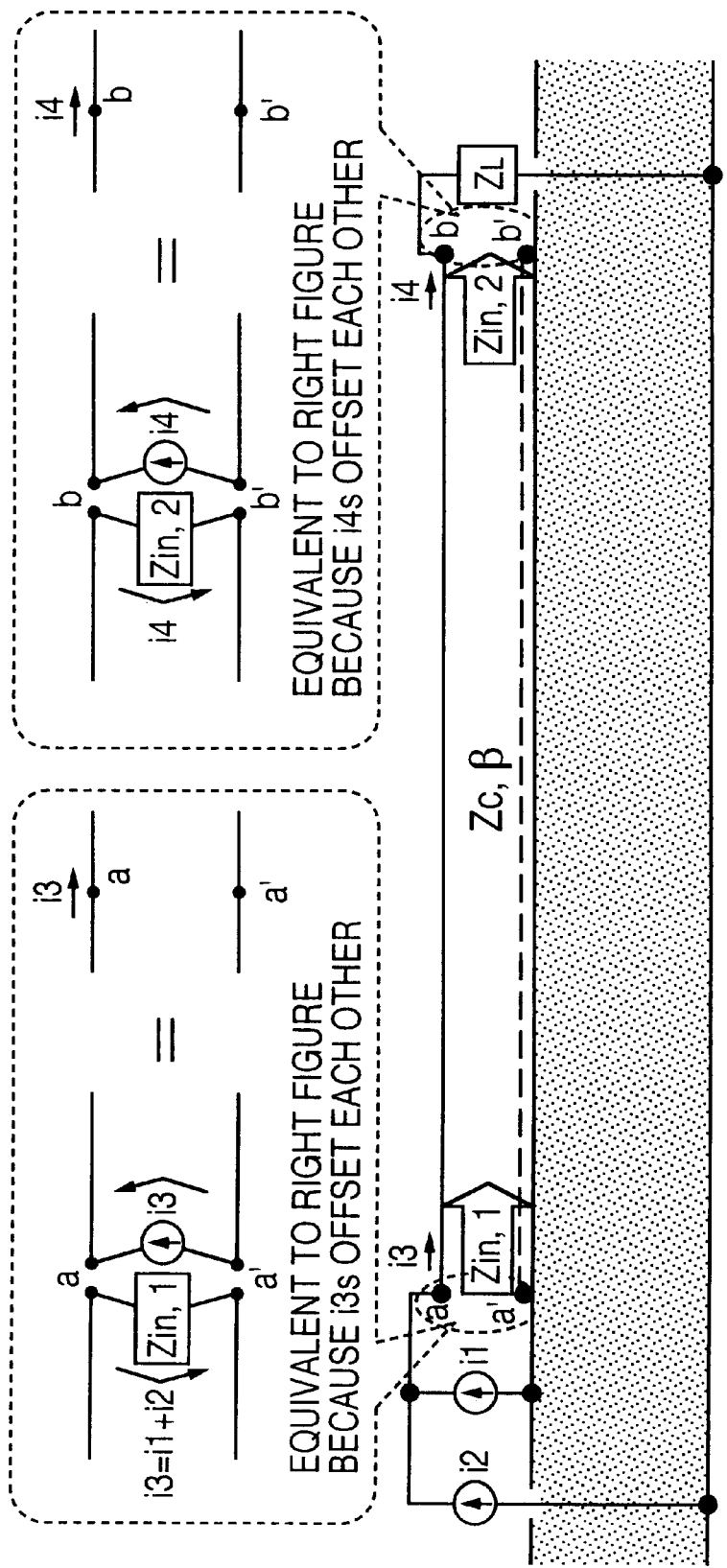
FIG. 14 shows the insertion of an electric current source and an input impedance at an input terminal and a load terminal of a distributed constant line.

When the process in FIG. 10 terminates, the electric current is computed in steps S7 through S10. Before these processes, the process shown in FIG. 14 is first performed. FIG. 14 shows the insertion of the electric current source and the input impedance at the input terminal and the load terminal of the distributed constant line. As shown in FIG. 14, the input terminal a—a' and the load terminal b—b' of the distributed constant line 23 are replaced with the input impedance and the electric current source. In FIG. 14, the electric current source $i_3$ refers to the electric current of the wave source. The $i_4$ indicates the output electric current at the output terminal of a transmission line, that is, the electric current to a load. The $Z_{in1}$ indicates the input impedance of the entire distributed constant line 23. The $Z_{in2}$ indicates the impedance with the load side viewed from the output terminal of the distributed constant line 23. Since the input impedance and the electric current flowing through the electric current source offset each other, the influence on the radiating electromagnetic wave can be ignored, and it is assumed that the electric currents $i_3$ and $i_4$ continuously flow at the terminals a—a' and b—b' respectively. These input impedances, etc. are obtained as follows.

Figure 15:
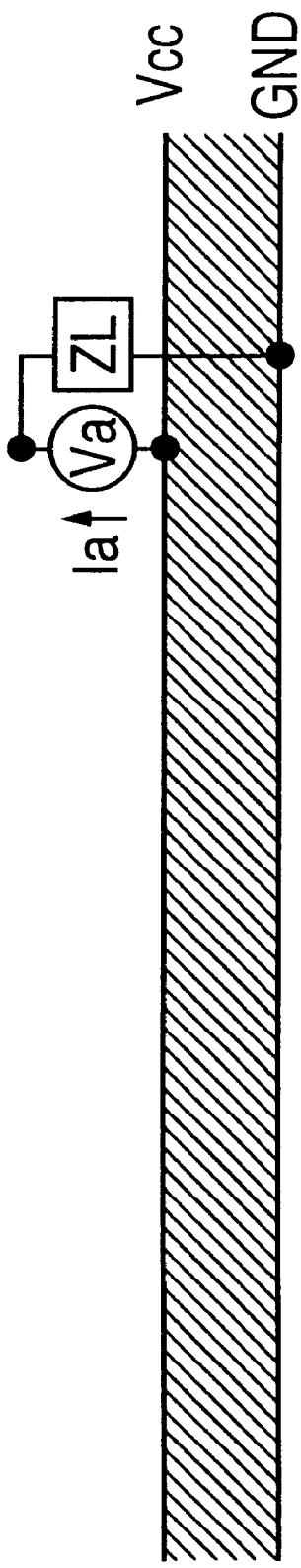
FIG. 15 shows the method of computing the input impedance at a load terminal of the distributed constant line.

FIG. 15 shows the method of obtaining the input impedance $Z_{in2}$ at the load terminal of a distributed constant line. In FIG. 15, the $Z_{in2}$ with the load side viewed from the output terminal b—b' of the distributed constant line 23 is computed by the following equation by obtaining the electric current $I_a$ in the moment method with an optional voltage $V_a$ added to the terminal b—b'.

$$Z_{in2} = V_a / I_a$$

Figure 16:
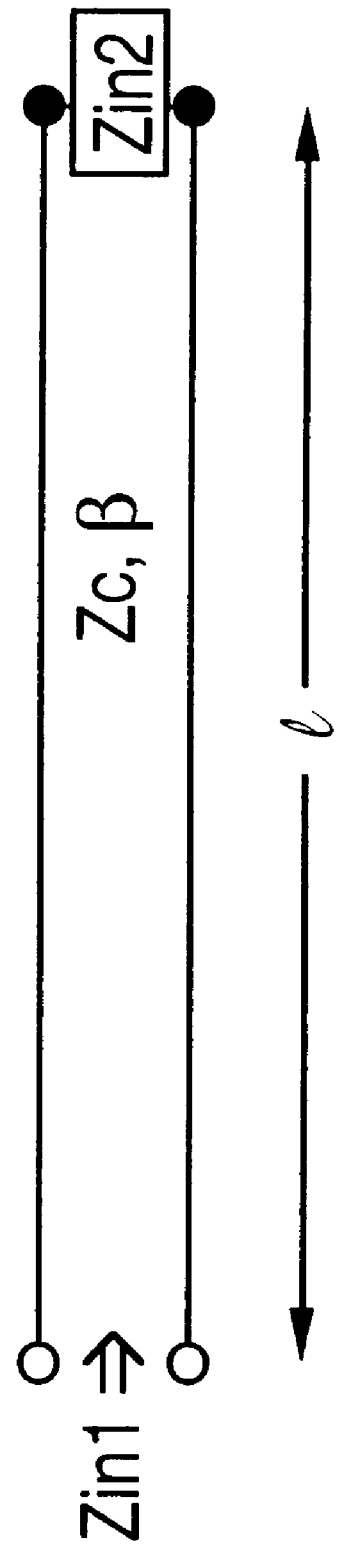
FIG. 16 shows the method of computing the input impedance at an input terminal of the distributed constant line.

FIG. 16 shows the method of computing the entire impedance of the distributed constant line 23, that is, the input impedance at the input terminal a—a'. As shown in FIG. 16, the input impedance $Z_{in1}$ at an input terminal is computed by the following equation using the input impedance $Z_{in2}$ at the load terminal obtained in FIG. 15.

$$Z_{in1} = Z_c \frac{Z_{in2} + jZ_c \tan\beta(kf_0)l}{Z_c + jZ_{in2}\tan\beta(kf_0)l}$$

Figure 17:
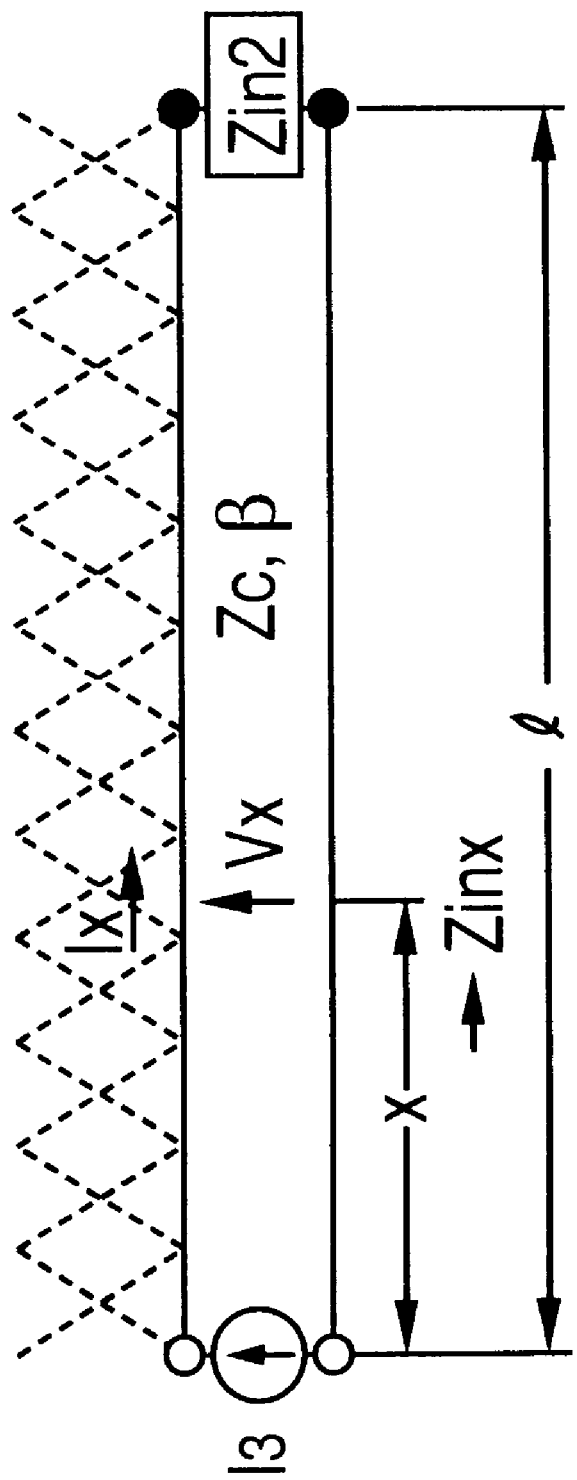
FIG. 17 shows the method of computing the distribution of the electric current in the distribution constant line.

Thus, the processes up to step S8 shown in FIG. 11 terminate, and is followed by the process in step S9. FIG. 17 shows the method of computing the distribution of the electric current in the distributed constant line. In FIG. 17, the electric current source $i_3$ is connected to the input terminal a—a' of the distributed constant line 23. First, the voltage $V_x$ at the distance x from the input terminal is computed. Using the obtained value, the electric current value $I_x$ at the point can be computed by the following equation.

$$V_x = V_0 \frac{Z_{in2}\cos\beta(kf_0)(l-x) + jZ_c\sin\beta(kf_0)(l-x)}{Z_{in2}\cos\beta(kf_0)l + jZ_c\sin\beta(kf_0)l}$$

$$Z_{inx} = Z_c \frac{Z_{in2} + jZ_c\tan\beta(kf_0)(l-x)}{Z_c + jZ_{in2}\tan\beta(kf_0)(l-x)}$$

$$I_x = \frac{V_x}{Z_{inx}}$$

Figure 18:
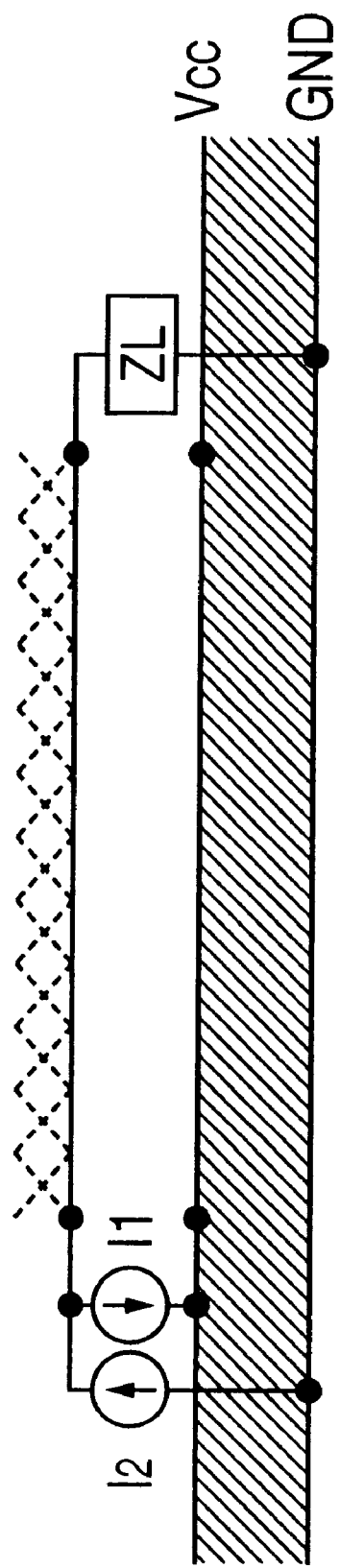
FIG. 18 shows the method of computing the distribution of the electric current throughout the multilayer.

Then, the distribution of the electric current of the entire multilayer substrate is computed in step S10 shown in FIG. 11. FIG. 18 shows the method of computing the distribution of the electric current of the entire multilayer substrate. As shown in FIG. 18, the distribution of the electric currents in the multilayer substrate is computed including the electric current flowing through the power supply layer and the ground layer in moment method using the $I_1$, $I_2$, and the distribution of the electric current in the distributed constant line 23 as the source of electric currents currently existing in the multilayer substrate.

Thus, when the electric current is obtained in the moment method, the distribution of the electric current is normally obtained after converting an electric current source into a voltage source. For example, the electric current sources $i_3$ and $i_4$ described in FIG. 14 are also converted into voltage sources. FIG. 19 shows the method of converting an electric current source into a voltage source in the moment method. As shown in FIG. 19, for example, the electric current source $i_3$ is converted into a voltage source $v_3$ appearing in the following equation using a resistor R having a value sufficiently larger than the self-impedance of a connected wire. A value of R can be in the range of 1 through 100MΩ according to the experiments.

$$v_3 = R \cdot i_3$$

Finally, the radiation intensity of an electromagnetic field is computed in step S11 shown in FIG. 11, and the process terminates.

Figure 20:
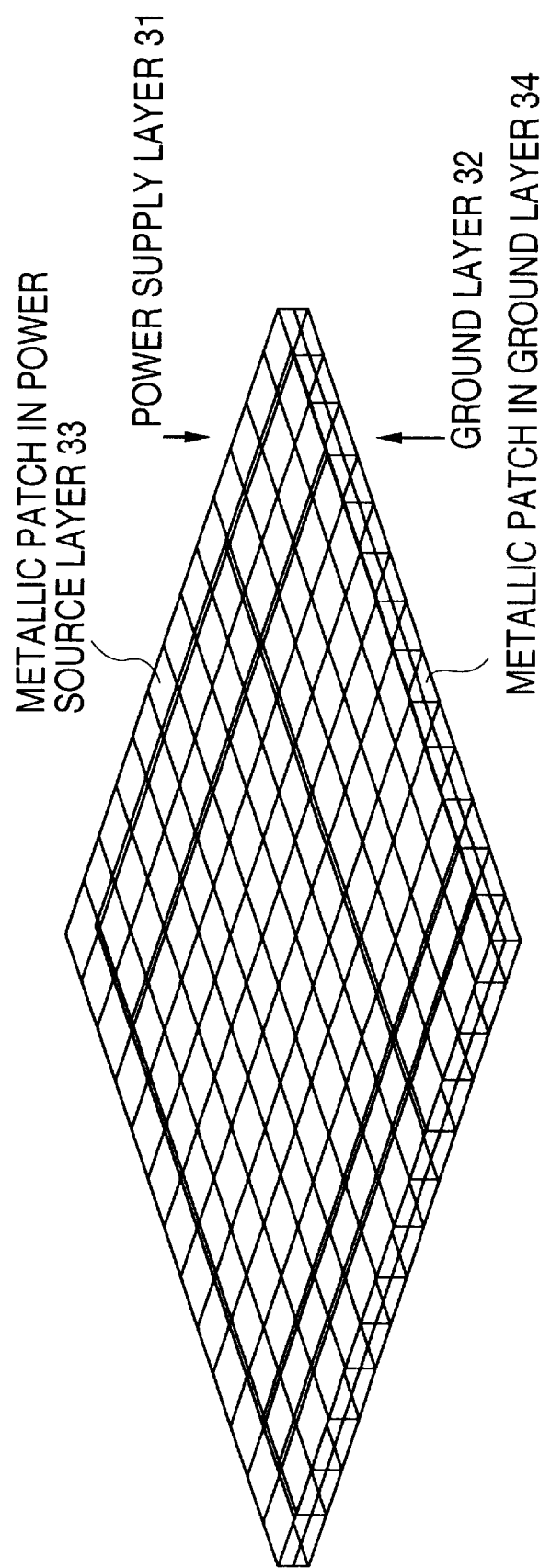
FIG. 20 shows how the power supply layer and the ground layer are divided into a mesh form.

Then, the process of generating a model between the power supply layer and the ground layer described by referring to FIG. 5 is described by referring to FIGS. 20 through 22. FIG. 20 shows the method of dividing the power supply layer and the ground layer of a multilayer substrate in a mesh format. As shown in FIG. 20, a power supply layer 31 is divided into rectangular metallic patches 33, and a ground layer 32 is divided into rectangular metallic patches 34.

Figure 21A:
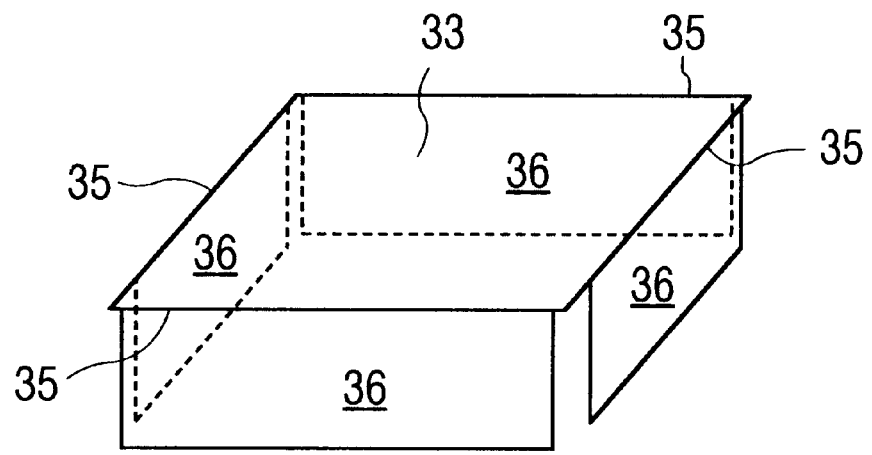
FIG. 21A shows a conductive patch (1) provided between the power supply layer and the ground layer.

FIG. 21A shows the conductive patch (1) provided between the power supply layer and the ground layer.

Figure 21B:
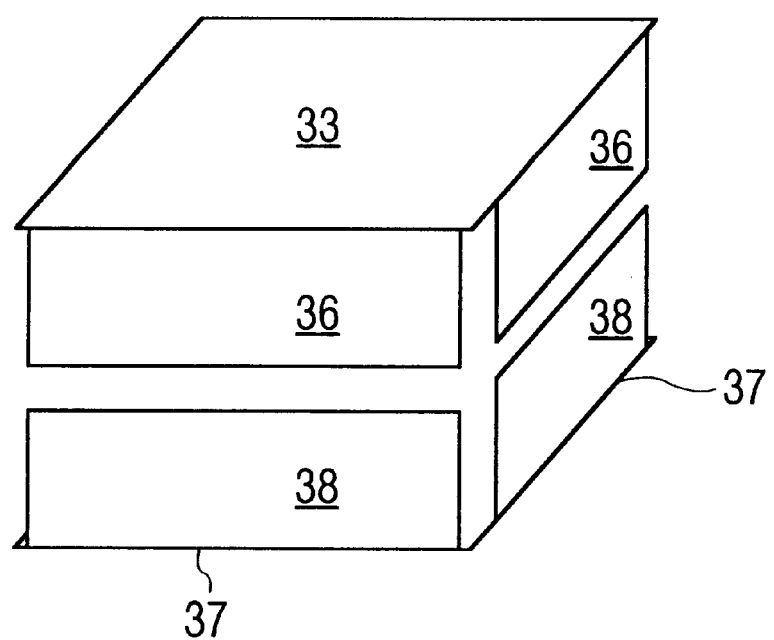
FIG. 21B shows a conductive patch (2) provided between the power supply layer and the ground layer.

FIG. 21B shows the conductive patch (2) provided between the power supply layer and the ground layer.

First, as shown in FIG. 21A, the rectangular conductive patches 36 are perpendicularly set from each mesh section unit line 35, which divides the power supply layer 31, to the ground layer 32 in such a way that they are not connected to each other. Then, as shown in FIG. 21B, the rectangular conductive patches 38 are perpendicularly set from each section unit line 37, which divides the ground layer 32, to the power supply layer 31 in such a way that they are not connected to each other with a small clearance to the corresponding conductive patch 36 of the power supply layer 31.

Figure 22A:
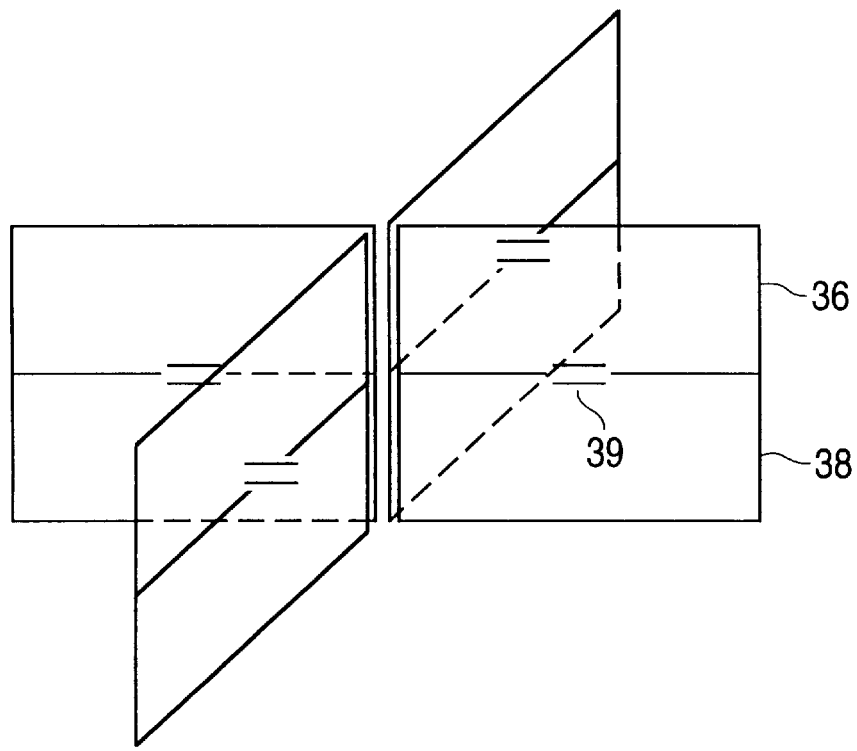
FIG. 22A shows a model of a dielectric portion between the power supply layer and the ground layer.
Figure 22B:
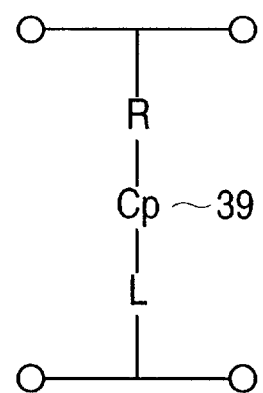
FIG. 22B shows a model of a dielectric portion between the power supply layer and the ground layer when the loss of a dielectric portion is taken into account.

FIG. 22A shows a model of a dielectric portion between the power supply layer and the ground layer. FIG. 22B shows a model of a dielectric portion between the power supply layer and the ground layer when the loss of a dielectric portion is taken into account. In FIG. 22A, a capacitor 39 is connected between the two conductive patches 36 and 38 described above by referring to FIG. 21. The capacitance of the capacitor 39 is computed by C/N where C indicates the capacitance of a capacitor formed by a dielectric portion inserted between the power supply layer 31 and the ground layer 32, and N indicates the number of sets of the conductive patches 36 and 38.

When a loss of a dielectric portion inserted between the power supply layer 31 and the ground layer 32 is taken into account, a model in which a resistor R and an inductance L are connected in series to the capacitor 39 is used as shown in FIG. 22B.

The reason why the power supply layer 31 and the ground layer 32 are divided as described above in a mesh format, and the portion between the power supply layer 31 and the ground layer 32 is represented by the conductive patches 36 and 38, is that the electric current flowing through the rectangular metallic patches is parallel with the sides of the rectangle, and the electric flux line in the dielectric portion matches the direction of the electric current flowing through the conductive patches 36 and 38. That is, the direction of the electric current flowing from the power supply layer 31 to the ground layer 32 matches the direction of the electric flux line, that is, the direction of the displacement current flowing through the dielectric portion.

FIGS. 23 and 24 show an example of a result of the computation of electromagnetic field intensity. FIG. 23 shows a result of the computation of an electromagnetic field spectrum when the present invention is not applied. FIG. 23 shows the spectrum whose electromagnetic field indicates the maximum value when an antenna is rotated by 360 degrees with a 3m distance from the multilayer substrate at 1 m high from the multilayer substrate. Actually, there are large differences between the actual measurement result marked with diamond symbols " ◊ " and the actual bar graph indicating the computation results.

FIG. 24 shows the result of the computation of the electromagnetic field spectrum when the present invention is applied. When compared with FIG. 23, FIG. 24 shows that the actual measurement value matches the computed value.

Figure 25:
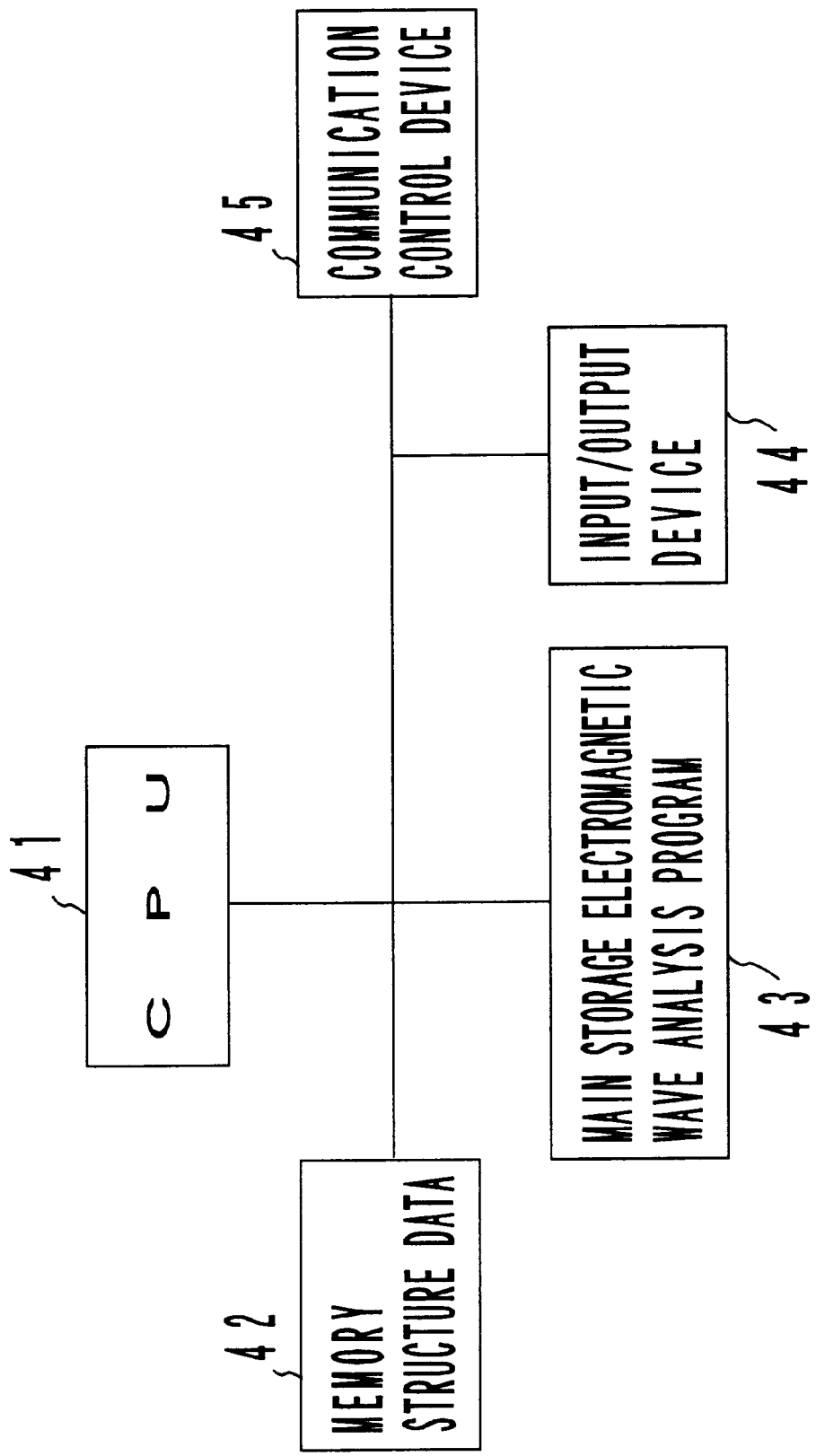
FIG. 25 is a block diagram showing the configuration of the computer system which realizes the electromagnetic wave analysis apparatus according to the present invention.

Finally described by referring to FIGS. 25 and 26 are the configuration of the computer system for realizing the electromagnetic wave analysis device according to the present invention, and the process of loading a program for analyzing the electromagnetic wave in the computer system from a storage medium.

FIG. 25 is a block diagram showing the configuration of the computer system for realizing the electromagnetic wave analysis device according to the present invention. In FIG. 25, the computer system comprises a central processing unit (CPU) 41 for controlling the entire system; memory 42 for storing structure data of a multilayer substrate, etc.; main storage 43 for temporarily storing a program for realizing a method of analyzing an electromagnetic wave according to the present invention, a circuit analysis program such as a SPICE, etc. as necessary to be executed by the CPU 41; an input/output device 44 for inputting/outputting multilayer substrate structure data, etc.; and a communications control device 45 for receiving/transmitting the multilayer substrate structure data, etc. input and output through, for example, a network 53.

FIG. 26 shows the process of loading an electromagnetic wave analysis program into a computer system. In FIG. 26, a computer 50 comprises a body 51 and memory 52. A program can be loaded from a portable storage medium 54 to the body 51, or can be loaded from a program provider through a network 53.

The program according to the present invention, the program shown in the flowchart in FIGS. 10 and 11, etc. are stored in, for example, the memory 52, and are executed by the body 51. The memory 52 can be, for example, random access memory (RAM), a hard disk, etc.

A program, etc. for electromagnetic wave analysis is stored in the portable storage medium 54 to analyze an electromagnetic wave by loading the program into the computer 50. The portable storage medium 54 can be an optical storage medium commonly marketed and distributed such as a memory card, a floppy disk, CD-ROM (compact disk read-only-memory), an optical disk, a magneto-optical disk, etc. Furthermore, a program for electromagnetic wave analysis can realize electromagnetic wave analysis by being transmitted and loaded from a program provider to the computer 50 side through the network 53.

As described above, the distribution of a signal layer electric current is obtained in the distributed constant line approximation method or the transmission line analysis method according to the present invention. The result can be combined with the entire multilayer substrate containing a model between the power supply layer and the ground layer in the moment method so that the computation can be performed without dividing a signal layer portion into a number of small computation elements. Therefore, a practical analysis can be realized, and computation for electromagnetic wave analysis can be performed at a high speed with high precision. As a result, an appropriate electric wave control can be easily set to improve the performance of an electric circuit device.

What is claimed is:

1. A radiating electromagnetic wave analysis apparatus which analyzes an electromagnetic wave radiating from a multilayer substrate, comprising:

signal layer electric current distribution computation means for obtaining distribution of an electric current flowing through a signal layer using a distributed constant line approximation method or a transmission line analysis method, and for generating a model of the multilayer substrate where electric currents, which are obtained by dividing an electric current of a wave source in the signal layer, are respectively inserted between a power supply layer and the signal layer, and between a ground layer and the signal layer as electric sources;

multilayer substrate electric current distribution computation means for computing distribution of an electric current of an entire multilayer substrate, including the power supply layer and the ground layer, in a moment method based on the distribution of the electric current in the signal layer, and the model where the electric current sources are respectively inserted between the power supply layer and the signal layer and between the ground layer and the signal layer: and radiating electromagnetic field intensity computation means for computing electromagnetic field intensity of an electromagnetic wave radiating from the multilayer substrate based on the distribution of the electric current of the entire multilayer substrate.

2. The apparatus according to claim 1, wherein said signal layer electric current distribution computation means obtains each electric current source by multiplying an electric current output from an IC driver in the signal layer by a rectangular wave corresponding to a duty ratio for the IC driver in order to divide the electric current of the wave source in the signal layer.

3. The apparatus according to claim 2, wherein said signal layer electric current distribution computation means performs a Fourier transform on each electric current source obtained by dividing the computed electric current of the wave source, and obtains an influence of a switch of the IC driver in a frequency area.

4. The apparatus according to claim 1, wherein
said signal layer electric current distribution computation means inserts an input impedance from a connection terminal, which links in the multilayer substrate a portion based on the distributed constant line approximation method or the transmission line analysis method to a portion based on the moment method by said multilayer substrate electric current distribution computation means to a load side, and a source of an electric current flowing through the connection terminal into the connection terminal.

5. The apparatus according to claim 1, wherein said multilayer substrate electric current distribution computation means computes the distribution of an electric current of the entire multilayer substrate by converting electric current for a portion based on the moment method in the multilayer substrate into a voltage source whose internal impedance is almost infinite.

6. The apparatus according to claim 1, wherein said signal layer electric current distribution computation means replaces both connection terminals with an input impedance and an electric current source, and the connection terminals link a portion computed based on the distributed constant line approximation method or the transmission line analysis method to a portion computed based on the moment method, wherein said connection terminals represent an input terminal and an output terminal of the distributed constant line.

7. A radiating electromagnetic wave analysis method for analyzing an electromagnetic wave radiating from a multilayer substrate, comprising the steps of:

obtaining distribution of an electric current flowing through a signal layer in a distributed constant line approximation method or a transmission line analysis method;

generating a model of the multilayer substrate where electric currents, which are obtained by dividing an electric current of a wave source in the signal layer, are respectively inserted between a power supply layer and the signal layer, and between a ground layer and the signal layer as electric sources;

computing distribution of an electric current of an entire multilayer substrate, including the power supply layer and the ground layer, in a moment method based on the obtained distribution of the electric current in the signal layer, and the model where the electric current sources are respectively inserted between the power supply layer and the signal layer and between the ground layer and the signal layer; and computing electromagnetic field intensity of an electromagnetic wave radiating from a multilayer substrate based on the distribution of the electric current of the entire multilayer substrate.

8. A computer-readable storage medium used to direct a computer to perform the steps of:

obtaining distribution of an electric current flowing through a signal layer in a distributed constant line approximation method or a transmission line analysis method;

generating a model of the multilayer substrate where electric currents, which are obtained by dividing an electric current of a wave source in the signal layer, are respectively inserted between a power supply layer and the signal layer, and between a ground layer and the signal layer as electric sources;

computing distribution of an electric current of an entire multilayer substrate, including the power supply layer and the ground layer, in a moment method based on the obtained distribution of the electric current in the signal layer, and the model where the electric current sources are respectively inserted between the power supply layer and the signal layer and between the ground layer and the signal layer; and computing electromagnetic field intensity of an electromagnetic wave radiating from a multilayer substrate based on the distribution of the electric current of the entire multilayer substrate.

9. A radiating electromagnetic wave analysis method for analyzing an electromagnetic wave radiating from a multilayer substrate comprising at least a power supply layer, a ground layer and a signal layer, comprising the steps of:

computing distribution of an electric current flowing through the signal layer according to a distributed constant line approximation method or a transmission line analysis method;

dividing the electric current flowing through the signal layer at a wave source into an electric current flowing through a portion between the power supply layer and the signal layer, and an electric current flowing through a portion between the ground layer and the signal layer, and inserting the divided electric current as electric current sources of each of the portions;

replacing both connection terminals, which are an input terminal and an output terminal of the distributed constant line, with an input impedance and an electric current source;

computing distribution of an electric current flowing through the multilayer substrate, including the power supply layer and the ground layer, according to a moment method by using the electric current inserted into the portion between the power supply layer and the ground layer and replaced electric current sources and input impedances; and computing electromagnetic field intensity of an electromagnetic wave radiating from the multilayer substrate based on the distribution of the electric current flowing through the entire multilayer substrate.

10. A computer-readable storage medium used to direct a computer to analyze an electromagnetic wave radiating from a multilayer substrate comprising at least a power supply layer, a ground layer and a signal layer, comprising the steps of:

computing distribution of an electric current flowing through the signal layer according to a distributed constant line approximation method or a transmission line analysis method;

dividing the electric current flowing through the signal layer at a wave source into an electric current flowing through a portion between the power supply layer and the signal layer, and an electric current flowing through a portion between the ground layer and the signal layer, and inserting the divided electric current as electric current sources of each of the portions;

replacing connection terminals, which are an input terminal and an output terminal of the distributed constant line, with an input impedance and an electric current source;

computing distribution of an electric current flowing through the entire multilayer substrate, including the power supply layer and the ground layer, according to a moment method by using the electric current inserted into the portion between the power supply layer and the ground layer and the replaced electric current sources and input impedances; and computing electromagnetic field intensity of an electromagnetic wave radiating from the multilayer substrate based on the distribution of the electric current flowing through the entire multilayer substrate.

* * * * *